United States Patent
Joei et al.

(10) Patent No.: US 10,964,754 B2
(45) Date of Patent: Mar. 30, 2021

(54) SOLID-STATE IMAGE PICKUP ELEMENT AND MANUFACTURING METHOD THEREOF, AND ELECTRONIC DEVICE

(71) Applicant: SONY SEMICONDUCTOR SOLUTIONS CORPORATION, Kanagawa (JP)

(72) Inventors: Masahiro Joei, Kanagawa (JP); Kenichi Murata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/462,683

(22) PCT Filed: Nov. 17, 2017

(86) PCT No.: PCT/JP2017/041419
§ 371 (c)(1),
(2) Date: May 21, 2019

(87) PCT Pub. No.: WO2018/101078
PCT Pub. Date: Jun. 7, 2018

(65) Prior Publication Data
US 2020/0083297 A1    Mar. 12, 2020

(30) Foreign Application Priority Data

Dec. 2, 2016 (JP) .............................. JP2016-235133

(51) Int. Cl.
*H01L 31/00* (2006.01)
*H01L 27/30* (2006.01)
*H01L 51/44* (2006.01)

(52) U.S. Cl.
CPC .......... *H01L 27/307* (2013.01); *H01L 51/448* (2013.01)

(58) Field of Classification Search
CPC .......... H01L 27/1463; H01L 27/14643; H01L 27/14621; H01L 27/1461; H01L 27/14645;
(Continued)

(56) References Cited

U.S. PATENT DOCUMENTS

2008/0035965 A1\* 2/2008 Hayashi ................ H01L 27/307
257/291
2011/0049591 A1 3/2011 Nakatani et al.
(Continued)

FOREIGN PATENT DOCUMENTS

| CN | 105308749 A | 2/2016 |
| CN | 107112315 A | 8/2017 |
| JP | 2003-332551 A | 11/2003 |

(Continued)

OTHER PUBLICATIONS

International Search Report of PCT Application No. PCT/JP2017/041419, dated Jun. 7, 2018, 8 pages.

*Primary Examiner* — Theresa T Doan
(74) *Attorney, Agent, or Firm* — Chip Law Group

(57) ABSTRACT

The present disclosure relates to a solid-state image pickup element in order to enable inhibition of a variation in the photoelectric conversion characteristic of an organic photoelectric conversion film due to atmospheric exposure and a manufacturing method of the solid-state image pickup element, and an electronic device. The solid-state image pickup element includes: a photoelectric conversion film formed above a semiconductor substrate; and a sidewall sealing a side face of the photoelectric conversion film. The sidewall includes a re-deposited film of a film directly under the sidewall. The present disclosure is applicable to, for example, a CMOS image sensor or the like.

10 Claims, 16 Drawing Sheets

(58) Field of Classification Search
CPC ....... H01L 2924/12043; H01L 25/0657; H01L 27/307; H01L 27/14665; H01L 31/02162; H01L 51/441; H01L 51/442; H01L 51/5234
USPC ........................................................ 257/443
See application file for complete search history.

(56) References Cited

U.S. PATENT DOCUMENTS

| | | |
|---|---|---|
| 2011/0049661 A1 | 3/2011 | Maehara et al. |
| 2012/0161270 A1 | 6/2012 | Maehara et al. |
| 2012/0305926 A1 | 12/2012 | Nakatani et al. |
| 2016/0372520 A1 | 12/2016 | Joei |

FOREIGN PATENT DOCUMENTS

| | | |
|---|---|---|
| JP | 2011-029337 A | 2/2011 |
| JP | 2011-071481 A | 4/2011 |
| JP | 2011-071482 A | 4/2011 |
| JP | 2011-071483 A | 4/2011 |
| JP | 2014-017374 A | 1/2014 |
| JP | 2015-015332 A | 1/2015 |
| JP | 2015-056554 A | 3/2015 |
| JP | 2017-168868 A | 9/2017 |
| KR | 10-2012-0064069 A | 6/2012 |
| KR | 10-2015-0027175 A | 3/2015 |
| KR | 10-2016-0030102 A | 3/2016 |
| TW | 201126709 A | 8/2011 |
| WO | 2011/025067 A1 | 3/2011 |
| WO | 2014/010432 A1 | 1/2014 |
| WO | 2015/001771 A1 | 1/2015 |
| WO | 2016/114377 A1 | 7/2016 |

\* cited by examiner

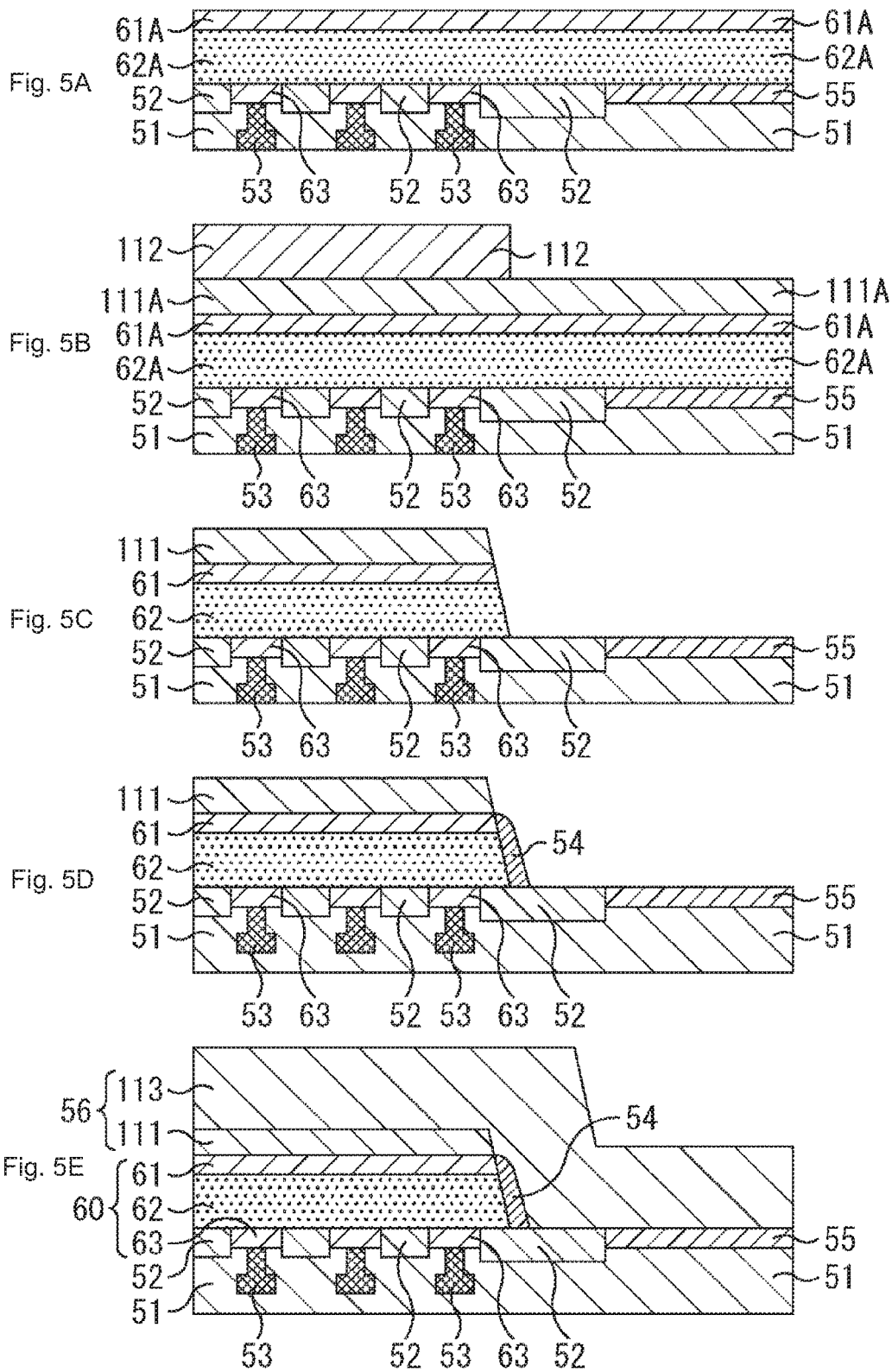

FIG. 6
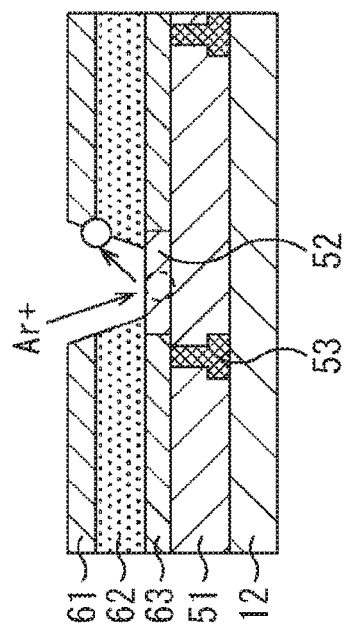
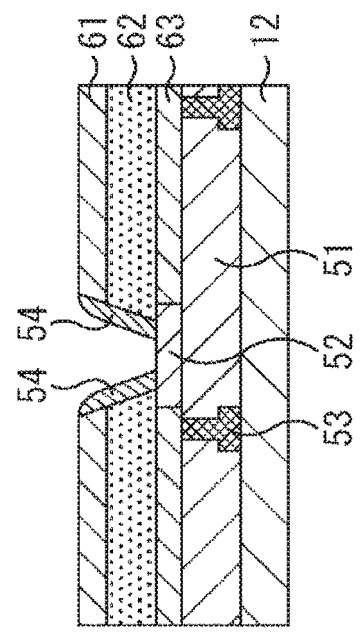

SOLID-STATE IMAGE PICKUP ELEMENT AND MANUFACTURING METHOD THEREOF, AND ELECTRONIC DEVICE

CROSS REFERENCE TO RELATED APPLICATIONS

This application is a U.S. National Phase of International Patent Application No. PCT/JP2017/041419 filed on Nov. 17, 2017, which claims priority benefit of Japanese Patent Application No. JP 2016-235133 filed in the Japan Patent Office on Dec. 2, 2016. Each of the above-referenced applications is hereby incorporated herein by reference in its entirety.

TECHNICAL FIELD

The present disclosure relates to a solid-state image pickup element and a manufacturing method thereof, and an electronic device. In particular, the present disclosure relates to a solid-state image pickup element that enables inhibition of a variation in the photoelectric conversion characteristic of an organic photoelectric conversion film due to atmospheric exposure and a manufacturing method of the solid-state image pickup element, and an electronic device.

BACKGROUND ART

In recent years, a charge coupled device (CCD) or complementary metal oxide semiconductor (CMOS) image sensor has a tendency of reduction in the pixel size. Accordingly, the number of photons (amount of light) incident on the unit pixel has decreased to lower the sensitivity of the pixel, whereby the signal/noise (S/N) ratio has sometimes decreased.

Furthermore, there has been widely used an image sensor adopting a pixel array including red, green, and blue pixels arrayed on a flat face, for example, a Bayer array with a primary color filter. For such an image sensor, for example, green light and blue light do not pass through the red pixel in the color filter and are not used for photoelectric conversion, thereby resulting in occurrence of a loss in terms of sensitivity. Furthermore, a false color may occur as color signals are generated through interpolation processing between pixels.

Meanwhile, there has been proposed an image sensor having a structure including three photoelectric conversion layers layered vertically to obtain photoelectric conversion signals of three colors with one pixel (see, for example, Patent Document 1).

For example, Patent Document 1 discloses a solid-state image pickup element having a structure including: a photoelectric conversion unit for detecting green light to generate a signal charge corresponding to the green light, the photoelectric conversion unit being provided on a silicon substrate; and two photoelectric conversion regions for detecting blue light and red light, the two photoelectric conversion regions being layered in the silicon substrate.

Furthermore, there has also been proposed a back-irradiation type solid-state image pickup element. Such a solid-state pickup element has a structure including one layer of photoelectric conversion film provided above a silicon substrate and two color photoelectric conversion units provided in the silicon substrate, and the circuit-formed face is formed on the opposite side to the light-receiving face (see, for example, Patent Document 2).

For such a back-irradiation type solid-state image pickup element, circuits, wires, and the like are not formed between an inorganic photoelectric conversion unit and an organic photoelectric conversion unit. Thus, the distance between the inorganic photoelectric conversion unit and the organic photoelectric conversion unit in the same pixel can be made close. As a result, there can be inhibited F-number dependence by each color and a variation in sensitivity between colors.

Meanwhile, since the organic photoelectric conversion film is generally vulnerable in resistance to H2O and O2 in the atmosphere, there need to construct a sealing structure in the structure including the organic photoelectric conversion film provided above the silicon substrate. For example, Patent Document 3 proposes a structure including a double-layered upper electrode provided to seal an organic photoelectric conversion film with a second upper electrode on the upper side of the structure.

CITATION LIST

Patent Documents

Patent Document 1: Japanese Patent Laid-Open No. 2003-332551
Patent Document 2: Japanese Patent Laid-Open No. 2011-29337
Patent Document 3: Japanese Patent Laid-Open No. 2015-56554

SUMMARY OF THE INVENTION

Problems to be Solved by the Invention

With the technology of Patent Document 3, however, the organic photoelectric conversion film needs exposure to the atmosphere until a sealing structure is constructed. Such atmospheric exposure has sometimes caused a variation in the photoelectric conversion characteristic of the outer peripheral portion of the organic photoelectric conversion film.

The present disclosure has been made in view of such circumstances, and is to enable inhibition of a variation in the photoelectric conversion characteristic of an organic photoelectric conversion film due to atmospheric exposure.

Solutions to Problems

A solid-state image pickup element according to a first aspect of the present disclosure includes: a photoelectric conversion film formed above a semiconductor substrate; and a sidewall sealing a side face of the photoelectric conversion film, the sidewall including a re-deposited film of a film directly under the sidewall.

A method of manufacturing a solid-state image pickup element according to a second aspect of the present disclosure includes: forming a photoelectric conversion film above a semiconductor substrate; and forming a sidewall sealing a side face of the photoelectric conversion film, the sidewall including a re-deposited film of a film directly under the sidewall.

An electronic device according to a third aspect of the present disclosure includes: a solid-state image pickup element including: a photoelectric conversion film formed above a semiconductor substrate; and a sidewall sealing a side face of the photoelectric conversion film, the sidewall including a re-deposited film of a film directly under the sidewall.

According to the first to third aspects of the present disclosure, the photoelectric conversion film is formed above the semiconductor substrate, and the sidewall sealing the side face of the photoelectric conversion film, the sidewall including the re-deposited film of the film directly under the sidewall.

A solid-state image pickup element according to a fourth aspect of the present disclosure includes: a photoelectric conversion film formed above a semiconductor substrate; a lower electrode formed separately for each pixel, beneath the photoelectric conversion film; and a dummy film in a layer of a peripheral circuit unit outside a pixel array unit, the layer identical in depth to a layer including the lower electrode, the dummy film being different in polishing rate from an insulating film between a plurality of the lower electrodes.

A method of manufacturing a solid-state image pickup element according to a fifth aspect of the present disclosure includes: forming, above a semiconductor substrate, a lower electrode separated for each pixel; forming a dummy film in a layer of a peripheral circuit unit outside a pixel array unit, the layer identical in depth to a layer including the lower electrode, the dummy film being different in polishing rate from an insulating film between a plurality of the lower electrodes; and forming a photoelectric conversion film on an upper face of each of the plurality of the lower electrodes.

An electronic device according to a sixth aspect of the present disclosure includes: a solid-state image pickup element including: a photoelectric conversion film formed above a semiconductor substrate; a lower electrode formed separately for each pixel, beneath the photoelectric conversion film; and a dummy film in a layer of a peripheral circuit unit outside a pixel array unit, the layer identical in depth to a layer including the lower electrode, the dummy film being different in polishing rate from an insulating film between a plurality of the lower electrodes.

According to the fourth to sixth aspects of the present disclosure, there are formed: the lower electrode separated for each pixel above the semiconductor substrate; the dummy film in the layer of the peripheral circuit unit outside the pixel array unit, the layer identical in depth to the layer including the lower electrode, the dummy film being different in polishing rate from the insulating film between the plurality of the lower electrodes; and the photoelectric conversion film on the upper face of each of the plurality of the lower electrodes.

The solid-state image pickup element and the electronic device may be independent devices or may be modules incorporated in other devices.

Effects of the Invention

According to the first to third aspects of the present disclosure, there can be inhibited a variation in the photoelectric conversion characteristic of the organic photoelectric conversion film due to atmospheric exposure.

According to the fourth to sixth aspects of the present disclosure, there can be reduced chemical mechanical polishing (CMP) dishing to improve planarity in structure.

Note that the effects described herein are not necessarily limited, and any of the effects described in the present disclosure may be applied.

BRIEF DESCRIPTION OF DRAWINGS

FIGS. 5A, 5B, 5C, 5D, and 5E are explanatory view of the first manufacturing method of the first embodiment.

FIG. 6 is an explanatory view of forming of a re-deposited film.

MODE FOR CARRYING OUT THE INVENTION

Hereinafter, modes for carrying out the present disclosure (hereinafter referred to as embodiments) will be described. Note that the description will be given in the following order.

1. Schematic Configuration Example of Solid-State Image Pickup Element
2. First Embodiment (Configuration Example of Solid-State Image Pickup Element with Sidewall and CMP Dummy Film)
3. Second Embodiment (Configuration Example Using Material with High Sealability)
4. Third Embodiment (Configuration Example Using Lower Electrode Material for CMP Dummy Film)
5. Fourth Embodiment (Configuration Example of Photoelectric Conversion Film Separated for Each Pixel)
6. Examples Applicable to Electronic Devices
7. Application Examples to Movable-Object Control System 1. Schematic Configuration Example of Solid-State Image Pickup Element FIG. 1 is a view of a schematic configuration of a solid-state image pickup element to which the technology of the present disclosure is applied.

Figure 1:
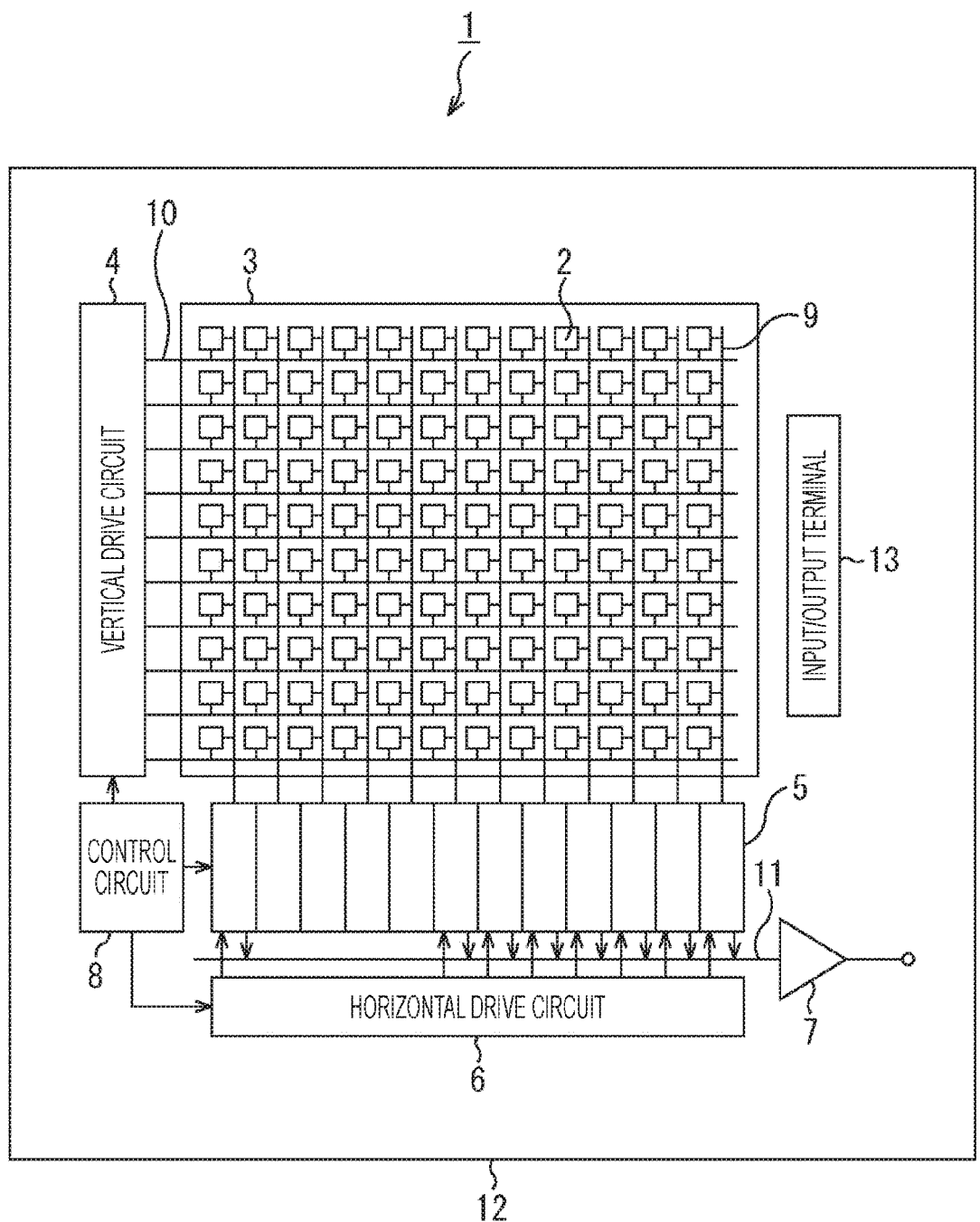
FIG. 1 is a view of a schematic configuration of a solid-state image pickup element to which the technology of the present disclosure is applied.

A solid-state image pickup element 1 of FIG. 1 includes: a pixel array unit 3 including pixels 2 disposed in a two-dimensional matrix; a peripheral circuit unit 21 (FIG. 2) outside the pixel array unit 3; and a semiconductor substrate 12 containing, for example, silicon (Si) as a semiconductor, the pixel array unit 3 and the peripheral circuit unit 21 being disposed on the semiconductor substrate 12. The peripheral circuit unit 21 includes a vertical drive circuit 4, column-signal processing circuits 5, a horizontal drive circuit 6, an output circuit 7, a control circuit 8, and the like.

Each pixel 2 includes a plurality of photoelectric conversion units layered in a substrate depth direction and a plurality of pixel transistors (so-called MOS transistors). In the plurality of pixel transistors, for example, each pixel transistor includes four transistors of a transfer transistor, a selection transistor, a reset transistor, and an amplification transistor.

Furthermore, the pixel 2 may have a shared pixel structure. This shared pixel structure includes a plurality of photodiodes, a plurality of transfer transistors, a floating diffusion (floating diffusion region) that is shared, and other pixel transistors each of which is shared. In other words, in such a shared pixel structure, photodiodes and transfer transistors included in a plurality of unit pixels share each of other pixel transistors.

The control circuit 8 receives: an input clock; and data instructing an operation mode or the like, and outputs data such as internal information regarding the solid-state image pickup element 1. In other words, the control circuit 8 generates a clock signal and a control signal to be the basis of operations of the vertical drive circuit 4, the column-signal processing circuit 5, the horizontal drive circuit 6, and the like, on the basis of a vertical synchronization signal, a horizontal synchronization signal, and a master clock. Then, the control circuit 8 outputs the generated clock signal and control signal to the vertical drive circuit 4, the column-signal processing circuits 5, the horizontal drive circuit 6, and the like.

The vertical drive circuit 4 includes, for example, a shift register. The vertical drive circuit 4 selects a pixel drive wire 10, supplies pulses for driving the pixels 2 to the selected pixel drive wire 10, and drives the pixels 2 for each row. In other words, the vertical drive circuit 4 sequentially vertically selects and scans each pixel 2 of the pixel array unit 3 for each row. Then, the vertical drive circuit 4 supplies a pixel signal based on a signal charge to the column-signal processing circuit 5 through a vertical signal line 9, the signal charge being generated in accordance with the amount of received light in the photoelectric conversion unit of each pixel 2.

The column-signal processing circuit 5 is arrayed for each column of the pixels 2, and performs signal processing such as noise removal for each pixel column, on a signal output from each pixel 2 for one row. For example, the column-signal processing circuit 5 performs signal processing such as correlated double sampling (CDS) and analog-to-digital (AD) conversion for removing fixed pattern noises specific to pixels.

The horizontal drive circuit 6 includes, for example, a shift register. The horizontal drive circuit 6 sequentially outputs horizontal scanning pulses to select sequentially each of the column-signal processing circuits 5, and causes each of the column-signal processing circuits 5 to output a pixel signal to a horizontal signal line 11.

The output circuit 7 performs predetermined signal processing on the signals sequentially supplied from each of the column-signal processing circuits 5 through the horizontal signal line 11, and outputs the resulting signals. For example, the output circuit 7 may only perform buffering, or may perform black level adjustment, column variation correction, various types of digital-signal processing, and the like in some cases. An input/output terminal 13 exchanges signals with the outside.

The solid-state image pickup element 1 with this arrangement as described above is a CMOS image sensor called a column AD type CMOS sensor including column-signal processing circuits 5 that perform CDS processing and AD conversion processing, the column-signal processing circuits 5 being disposed for each pixel column.

Note that the solid-state image pickup element 1 with the technology of the present disclosure applied is not limited to such a column AD type, and may be applicable to, for example, an area AD type in which a plurality of adjacent pixels 2 shares an analog-to-digital converter (ADC), or the like.

2. First Embodiment

<Cross-Sectional Structure>

Figure 2:
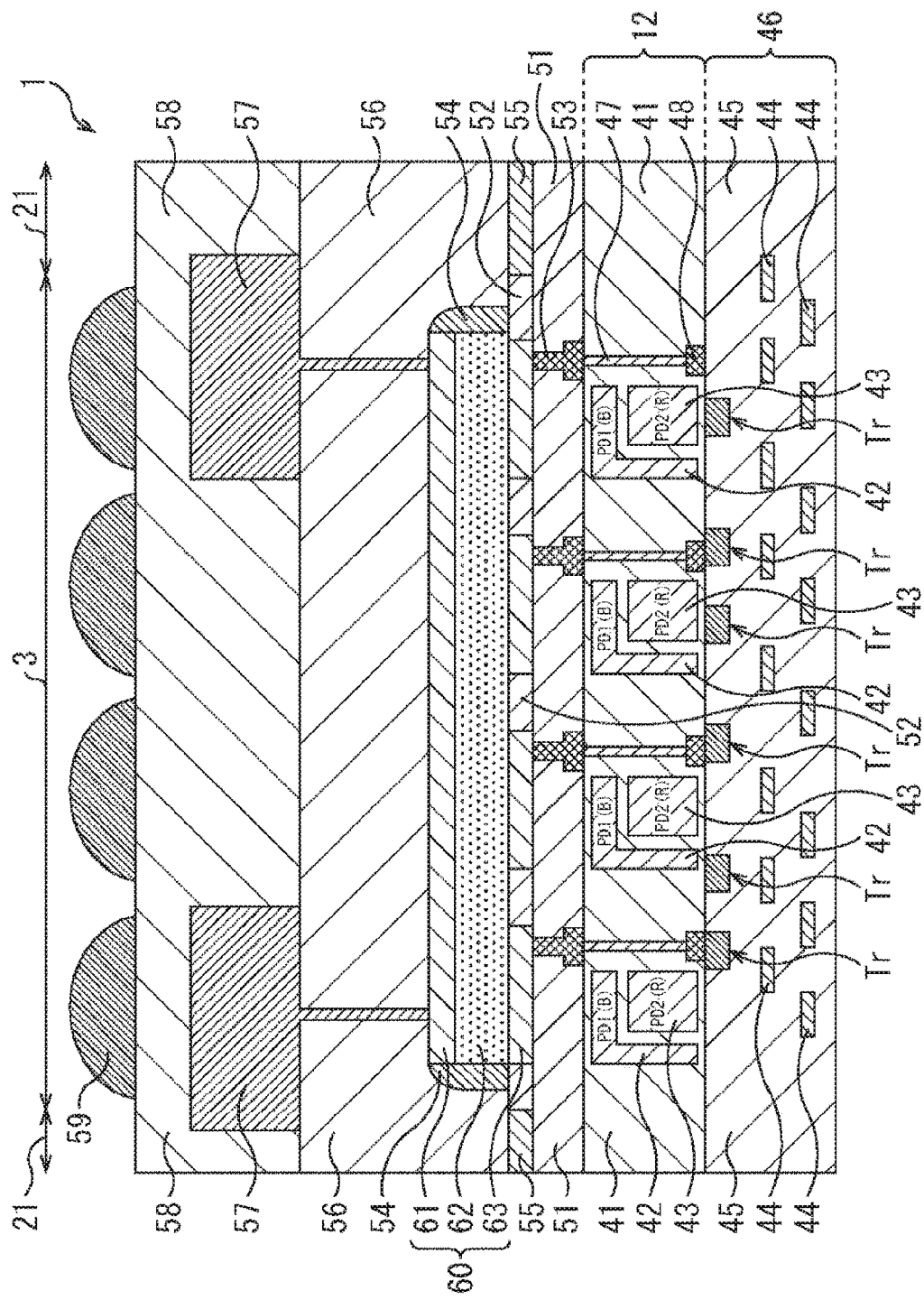
FIG. 2 is a view of a cross-sectional structure according to a first embodiment of the solid-state image pickup element.

FIG. 2 is a view of a cross-sectional structure according to a first embodiment of the solid-state image pickup element 1.

Note that the cross-sectional structure of FIG. 2 illustrates a cross-sectional structure of four pixels, due to limitation of space.

The semiconductor substrate 12 includes a first conduction type (e.g., P-type) semiconductor region 41 and second conduction type (e.g., N-type) semiconductor regions 42 and 43. The second conduction type semiconductor regions 42 and 43 are formed and layered in the depth direction in units of pixels, within the first conduction type semiconductor region 41. Thus, photodiodes PD1 and PD2 each having a PN junction are formed in the depth direction. The photodiodes PD1 each having the semiconductor region 42 as a charge accumulation region serves as a photoelectric conversion unit that receives blue light to perform photoelectric conversion. The photodiodes PD2 each having the semiconductor region 43 as another charge accumulation region serves as a photoelectric conversion unit that receives red light to perform photoelectric conversion.

A multi-level wiring layer 46 is formed on the front face side of the semiconductor substrate 12 on the lower side in FIG. 2, the multi-level wiring layer 46 including a plurality of pixel transistors Tr, for example, that reads charges accumulated in the photodiodes PD1 and PD2, a plurality of wiring layers 44, and an interlayer insulating film 45.

On the other hand, a photoelectric conversion unit 60 is formed though insulating films 51 and 52 on the back face side of the semiconductor substrate 12 on the upper side in FIG. 2. The photoelectric conversion unit 60 includes an upper electrode 61, an organic photoelectric conversion film 62, and lower electrodes 63 together layered. The organic photoelectric conversion film 62 is interposed between the upper electrode 61 and the lower electrodes 63. The upper electrode 61 is formed commonly to all the pixels of the pixel array unit 3, and the lower electrodes 63 are formed separately for each pixel of the pixel array unit 3.

The photodiodes PD1 and PD2 in the semiconductor substrate 12 and the multi-level wiring layer 46 on the front face side of the semiconductor substrate 12 are formed, for example, as follows.

First, the photodiodes PD1 and PD2 are formed inside the semiconductor substrate 12 having a predetermined thickness before being thinned, and the plurality of pixel transistors Tr and a plurality of charge accumulation units 48 are formed on the front face side of the semiconductor substrate 12.

Next, the vertical drive circuit 4, the control circuit 8, and the like are formed in the peripheral circuit unit 21, and then the multi-level wiring layer 46 is formed on the front face side of the semiconductor substrate 12. Thereafter, a supporting substrate (not illustrated) is attached to the multi-level wiring layer 46, and the back face side of the semiconductor substrate 12 as the light-irradiation face side is thinned. As a result, as illustrated in FIG. 2, the first conduction type (e.g., P-type) semiconductor region 41 is thinly formed on the respective upper faces of the second conduction type (e.g., N-type) semiconductor regions 42.

Finally, through holes penetrating through the semiconductor substrate 12 are formed, from the front face side of the semiconductor substrate 12, at positions respectively connected to the charge accumulation units 48. A predetermined metallic material is buried into each though hole to form a conductive plug 47. Use of a layered film containing titanium (Ti) and titanium nitride (TiN) as barrier metals and tungsten (W) is preferable as a material of the conductive plug 47. Note that, although not illustrated, the outer circumference of the conductive plug 47 is insulated with an insulating film containing silicon oxide (SiO2), silicon nitride (SiN), or the like.

The insulating film 51 is formed on the substrate upper face on the back face side of the semiconductor substrate 12. The insulating film 51 can include one layer or a plurality of layers including a material such as silicon oxide (SiO2), silicon nitride (SiN), silicon oxynitride (SiON), or hafnium oxide (HfO2).

In order to reduce the interface state with the semiconductor substrate 12 and inhibit occurrence of dark current from the interface state between the semiconductor substrate 12 and the insulating film 51, adoption of a film having a low interface state is preferable for the insulating film 51. For such an insulating film 51, there can be used a layered structure including a hafnium oxide (HfO2) film deposited by an atomic layer deposition (ALD) method and a SiO2 film deposited by a plasma chemical vapor deposition (CVD) method, for example. Note that the structure and deposition methods of the insulating film 51 are not limited to these structure and deposition methods.

The lower electrodes 63 are coupled respectively, through metallic wires 53 penetrating through the insulating film 51, to the conductive plugs 47 penetrating through the semiconductor region 41 of the semiconductor substrate 12. The metallic wires 53 each includes, for example, a material such as tungsten (W), aluminum (Al), or copper (Cu).

Charges generated by the photoelectric conversion in the photoelectric conversion unit 60 are transferred to the charge accumulation units 48 through the metallic wires 53 and the conductive plugs 47. The charge accumulation units 48 temporarily accumulate the charges photoelectrically converted in the photoelectric conversion unit 60 until the charges are read out.

An insulating film 52 is formed between each lower electrode 63 formed separately for each pixel. The insulating film 52 includes, for example, a SiO2 film. Note that the insulating films 51 and 52 may include the same material.

For example, a transparent conductive material such as indium tin oxide (ITO), zinc oxide (ZnO), or indium zinc oxide (IZO) is used as a material of the upper electrode 61 and the lower electrodes 63. The upper electrode 61 and the lower electrodes 63 each have a film thickness of, for example, about 50 nm.

The organic photoelectric conversion film 62 receives green light to perform photoelectric conversion. For the organic photoelectric conversion film 62, examples of a material having sensitivity only to green light include a combination of organic materials containing a quinacridone compound (electron-donating substance) and a perylene compound (electron-accepting substance). The organic photoelectric conversion film 62 is formed having a film thickness of, for example, about 155 nm.

The side face of an end of each of the upper electrode 61 and the organic photoelectric conversion film 62 is sealed with a sidewall 54. The sidewall 54 includes a re-deposited film formed by physically sputtering an underlying insulating film 52 to reattach the material of the underlying insulating film 52 to the side face of each of the upper electrode 61 and the organic photoelectric conversion film 62. In the first embodiment, the insulating film 52 directly under the sidewall 54 includes a SiO2 film, so that a material of the sidewall 54 contains at least SiO.

There is formed a CMP dummy film 55 in the peripheral circuit unit 21 having the depth direction in a layer identical to a layer including the lower electrodes 63 and the planar direction outside the pixel array unit 3, the CMP dummy film 55 serving as a stopper during planarization treatment by chemical mechanical polishing (CMP).

The CMP dummy film 55 includes, for example, a material such as silicon nitride (SiN), silicon oxynitride (SiON), silicon carbide oxide (SiCO), silicon carbide nitride (SiCN), or silicon oxycarbonitride (SiCNO).

A sealing film (protecting film) 56 covers on the upper electrode 61, the insulating films 52, the sidewall 54, and the CMP dummy film 55. Then, a light-shielding film 57 is formed on the sealing film 56.

As illustrated in FIG. 2, the light-shielding film 57 is connected to the upper electrode 61 at predetermined locations, and also serves as a metallic wire for applying a predetermined bias voltage to the upper electrode 61. Examples of a material of the light-shielding film 57 include a low-transmittance material such as tungsten (W), titanium (Ti), titanium nitride (TiN), aluminum (Al), or copper (Cu).

A sealing film 58 is further formed on the light-shielding film 57 overlying the sealing film 56, and an on-chip lens 59 is formed for each pixel, on the upper face of the sealing film 58 formed planarly.

Each of the sealing films 56 and 58 contains an optically-transparent inorganic material, and includes a single-layer film containing any of silicon nitride (SiN), silicon oxynitride (SiON), aluminum oxide (AlO), or aluminum nitride (AlN), or a layered film containing two or more thereof, for example.

Examples of a material of the on-chip lens 59 to be used include a silicon nitride film (SiN), or a resin material such as: a styrene resin; an acrylic resin; a styrene-acrylic copolymer resin; or a siloxane resin. The sealing film 58 and the on-chip lens 59 can include the same material.

The solid-state image pickup element 1 according to the first embodiment with the above-described configuration serves as a back-irradiation type CMOS image pickup element in which light enters from the back face side opposite to the front face side of the semiconductor substrate 12 with the pixel transistors Tr formed.

The solid-state image pickup element 1 of the first embodiment has a feature in that the sidewall 54 is formed on the side face of the end of each of the upper electrode 61 and the organic photoelectric conversion film 62. This arrangement enables sealing of the organic photoelectric conversion film 62, so that there can be inhibited a variation in the photoelectric conversion characteristic of the outer peripheral portion of the organic photoelectric conversion film 62.

Furthermore, the solid-state image pickup element 1 of the first embodiment has another feature in that the CMP dummy film 55 is formed in the layer identical to the layer including the lower electrodes 63 and outside the pixel array unit 3. This arrangement enables improvement of planarity as described later with reference to FIG. 8 and inhibition of reduction in yield.

Figure 3:
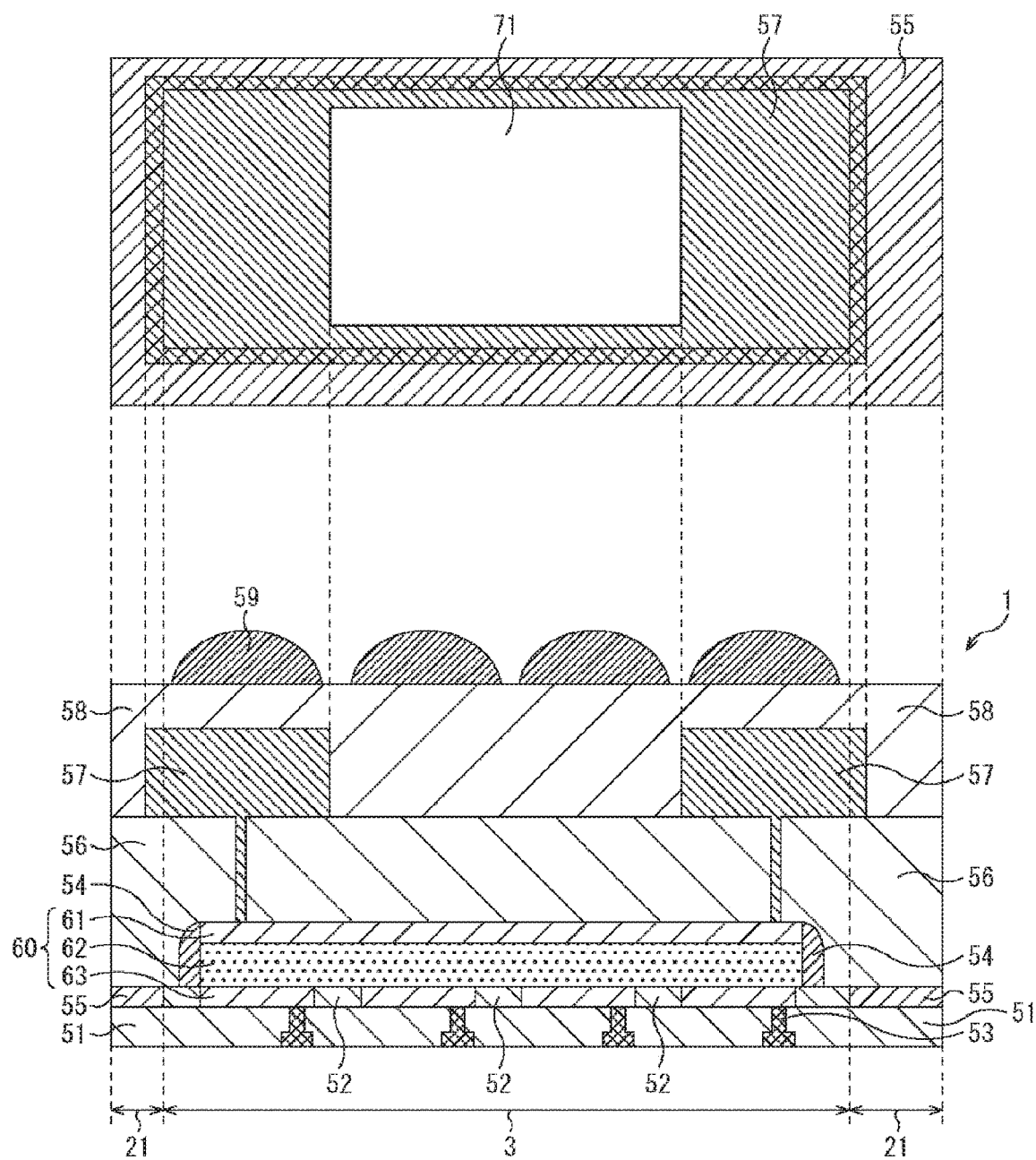
FIG. 3 is a plan view and a cross-sectional view of a region with a chemical mechanical polishing (CMP) dummy film and a light-shielding film formed.

FIG. 3 is a plan view of a region with the CMP dummy film 55 and the light-shielding film 57 formed, in accordance with the cross-sectional view of the solid-state image pickup element 1.

Note that the cross-sectional view of FIG. 3 omits illustrations of the semiconductor substrate 12 with the photodiodes PD1, PD2, and the like formed and the multi-level wiring layer 46 on the front face side of the semiconductor substrate 12.

As illustrated in FIG. 3, the CMP dummy film 55 is formed in the peripheral circuit unit 21 outside the pixel array unit 3. In other words, an opening region where no CMP dummy film 55 is formed other than the peripheral circuit unit 21 is the pixel array unit 3.

An region inside the pixel array unit 3 where no lightshielding film 57 is formed serves as an effective pixel area 71 including pixels two-dimensionally disposed, the pixels outputting pixel signals according to the amount of received light. The planar region where the light-shielding film 57 is formed is an optical black region including pixels disposed, the pixels generating a black reference level. The outer peripheral portion of the light-shielding film 57 and the inner peripheral portion of the CMP dummy film 55 partially overlap.

The peripheral circuits such as: the vertical drive circuit 4; the column-signal processing circuits 5; the horizontal drive circuit 6; the output circuit 7; and the control circuit 8, and electrode pads and the like are disposed in the peripheral circuit unit 21 with the CMP dummy film 55 formed.

<First Manufacturing Method>

Next, with reference to FIGS. 4A, 4B, 4C, 4D, 4E, 5A, 5B, 5C, 5D, and 5E, a first manufacturing method of the first embodiment illustrated in FIG. 2 will be described.

In FIGS. 4A, 4B, 4C, 4D, 4E, 5A, 5B, 5C, 5D, and 5E, there will be described a method of manufacturing a substrate upper portion of the light-irradiation face side (back face side) of the semiconductor substrate 12.

Figure 4A:
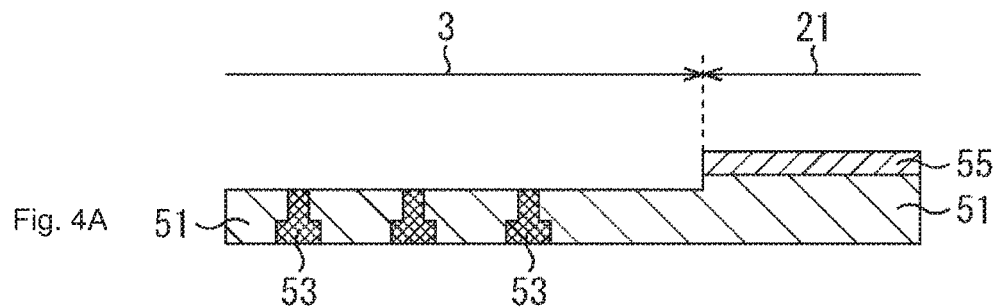
FIGS. 4A, 4B, 4C, 4D, and 4E are explanatory view of a first manufacturing method of the first embodiment.

First, as illustrated in FIG. 4A, on the light-irradiation face side of the semiconductor substrate 12, for example, there are formed the insulating film 51 including one layer or a plurality of layers including a material such as: silicon oxide ($SiO_2$); silicon nitride (SiN); silicon oxynitride (SiON); or hafnium oxide ($HfO_2$), and metallic wires 53. Here, as described above, in order to inhibit occurrence of dark current, a film having a low interface state is adopted for the interface of the insulating film 51 in contact with the semiconductor substrate 12. The metallic wires 53 need to be in contact with the conductive plugs 47 in the semiconductor substrate 12, respectively, and also each metallic wire 53 is to be used as a light-shielding film. Thus, use of, for example, a layered film containing titanium (Ti) and titanium nitride (TiN) as barrier metals and tungsten (W) is preferable.

Then, a material serving as the CMP dummy film 55, for example, a SiN film is deposited on the respective upper faces of the insulating film 51 and metallic wires 53 by a CVD method, and the SiN film at the pixel array unit 3 is removed by a lithographic technique and dry etching. As a result, the CMP dummy film 55 is formed in the peripheral circuit unit 21 outside the pixel array unit 3.

Figure 4B:
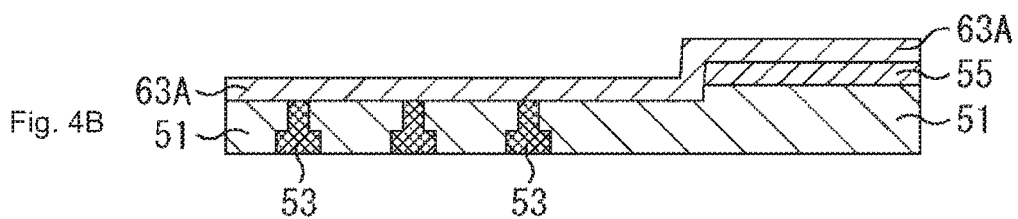

Next, as illustrated FIG. 4B, a material serving as each lower electrode 63, for example, ITO 63A, is deposited by a sputtering method, over the respective upper faces of the insulating film 51, metallic wires 53, and CMP dummy film 55.

Figure 4C:
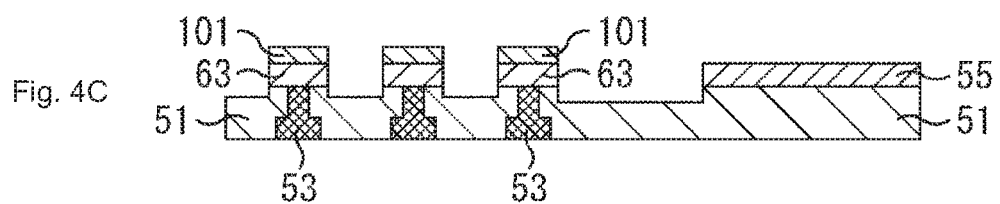

Then, as illustrated in FIG. 4C, an oxide film ($SiO_2$) 101 formed on the upper face of the ITO 63A is patterned such that only a portion for forming each lower electrode 63 remains. Thereafter, the ITO 63A is processed by dry etching or wet etching. The portion remains after the etching of the ITO 63A serves as each lower electrode 63 formed in units of pixels.

Note that the material of the lower electrode 63 is not limited to the above-described ITO, and tin oxide $SnO_2$ (doped) can be used. Furthermore, examples of the material of the lower electrode 63 that can be used include: aluminum zinc oxide (Al is doped into ZnO, e.g., AZO), gallium zinc oxide (Ga is doped into ZnO, e.g., GZO), indium zinc oxide (In is doped into to ZnO, e.g., IZO), in the case of using a zin oxide material. Moreover, there can be used IGZO, CuI, $InSbO_4$, ZnMgO, $CuInO_2$, $MgIn_2O_4$, CdO, $ZnSnO_3$, or the like, for the material of the lower electrode 63.

Figure 4D:
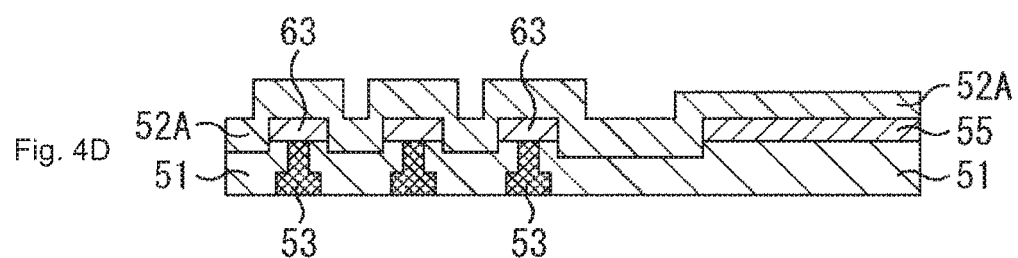
Figure 4E:
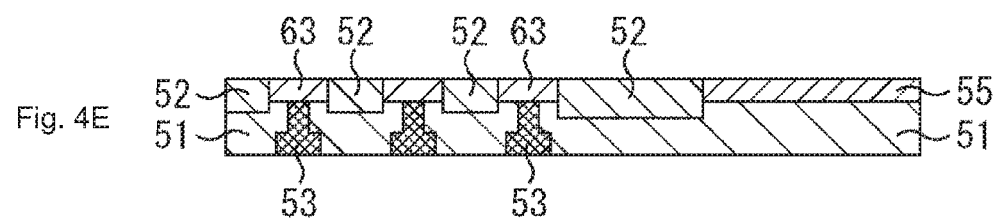

Next, as illustrated in FIG. 4D, an insulating film 52A such as a $SiO_2$ film is deposited over the respective upper faces of the lower electrodes 63 and CMP dummy film 55. Thereafter, as illustrated in FIG. 4E, for example, planarization treatment by chemical mechanical polishing (CMP) is performed to polish the insulating film 52A until the lower electrodes 63 and the CMP dummy film 55 are exposed. As a result, the insulating film 52 is buried between each adjacent lower electrode 63.

In the planarization treatment using CMP, polishing is performed until the insulating film 52A on the respective upper faces of the lower electrodes 63 is completely removed. As a result, the height of the upper face of the CMP dummy film 55 is formed to be identical to the height of the respective upper faces of the lower electrodes 63, or lower than the height of the respective upper faces of the lower electrodes 63. Alternatively, in order to completely remove the insulating film 52A on the respective upper faces of the lower electrodes 63, the height of the upper face of the CMP dummy film 55 may be formed to be lower in advance than the height of the respective upper faces of the lower electrodes 63.

Next, as illustrated in FIG. 5A, an organic photoelectric conversion film 62A and an upper electrode film 61A are layered on the respective planarized upper faces of the lower electrodes 63, insulating films 52, and CMP dummy film 55.

The organic photoelectric conversion film 62A is formed, for example, by depositing quinacridone by a vacuum evaporation method. Furthermore, the organic photoelectric conversion film 62A has a structure, in which, for example, an electron blocking film concurrently serving as a buffer film, a photoelectric conversion film, a hole blocking film, a hole blocking concurrently serving as a buffer film, and a work function adjustment film are layered on the lower electrodes 63. Furthermore, for example, the organic photoelectric conversion film 62 adopts a structure including at least one of an organic p-type semiconductor or an organic n-type semiconductor. More preferably, it is desirable to adopt a p-i-n bulk heterojunction structure including a p-type blocking layer, a co-deposition phase with a p-type and an n-type (i phase), and an n-type blocking layer.

Furthermore, as each of the organic p-type semiconductor and the organic n-type semiconductor included in the organic photoelectric conversion film 62A, there can be particularly preferably used, any one of a quinacridone derivative, a naphthalene derivative, an anthracene derivative, a phenanthrene derivative, a tetracene derivative, a pyrene derivative, a perylene derivative, or a fluoranthene derivative. Furthermore, there may be used a polymer such as: phenylenevinylene; fluorene, carbazole; indole; pyrene; pyrrole; picoline; thiophene; acetylene; or diacetylene, and a derivative thereof. Moreover, there can be preferably used a chain compound prepared by condensing a condensed polycyclic aromatic compound and an aromatic ring or a heterocyclic compound such as: a metal complex dye; a cyanine dye; a merocyanine dye; a phenylxanthene dye; a triphenylmethane dye; a rhodacyanine dye; a xanthene dye; a macrocyclic azaanuren dye; an azulene dye; a naphthoquinone; an anthraquinone dye; an anthracene; and pyrene, or two nitrogen-containing heterocyclic rings such as quinoline; benzothiazole; or benzoxazole each having a squarylium group and a croconic methine group as a bonding chain, a dye similar to a cyanine-like dye bonded by a squarylium group and a croconic methine group, or the like.

Moreover, as the above-described metal complex dye, a dithiol metal complex dye, a metal phthalocyanine dye, a metalloporphyrin dye, or a ruthenium complex dye is preferable, and a ruthenium complex dye is particularly preferable. Note that the material of the organic photoelectric conversion film 62A is not limited to the above-described ones, and the organic photoelectric conversion film 62A may be formed by a coating method.

The upper electrode film 61A is required to be transparent to visible light, and is formed, for example, by depositing ITO by using a sputtering method. Note that it is generally known that the characteristic of the upper electrode film 61A largely vary under the influence of moisture, oxygen, hydrogen, or the like. Thus, it is desirable that the upper electrode film 61A and the organic photoelectric conversion film 62A are deposited in a consistent vacuum. Furthermore, in order to prevent denaturation of the organic photoelectric conversion film 62A due to ultraviolet rays during manufacture, it is preferable that the upper electrode film 61A includes a material that absorbs ultraviolet rays having a wavelength of 400 nm or less.

Note that the material of the upper electrode film 61A is not limited to the above-described ITO, and tin oxide SnO2 (doped) can be used. Furthermore, examples of the material of the upper electrode film 61A that can be used include: aluminum zinc oxide (Al is doped into ZnO, e.g., AZO); gallium zinc oxide (Ga is doped into ZnO, e.g., GZO); or indium zinc oxide (In is doped into ZnO, e.g., IZO), in the case of using a zin oxide material. Moreover, there can be used IGZO, CuI, InSbO4, ZnMgO, CuInO2, MgIn2O4, CdO, ZnSnO3, or the like, for the material of the upper electrode 61.

Next, as illustrated in FIG. 5B, a SiN film 111A as a hard mask and a resist 112 are layered on the upper face of the upper electrode film 61A, and the resist 112 is patterned such that only a region above the lower electrodes 63 remains.

Then, as illustrated in C of FIG. 5C, dry etching is performed to remove the SiN film 111A, the upper electrode film 61A, and the organic photoelectric conversion film 62A in the region where no resist 112 is formed. As a result, the SiN film 111, the upper electrode 61, and the organic photoelectric conversion film 62 are formed. The upper electrode 61 and the organic photoelectric conversion film 62 are processed, and then the resist 112 is peeled off.

Note that, regarding patterning of both the upper electrode 61 and the organic photoelectric conversion film 62 or either of the upper electrode 61 or the organic photoelectric conversion film 62, there may be used patterning with a shadow mask or the like, in addition to the above-described patterning by a photolithographic technique and dry etching.

After peeling of the resist 112, as illustrated in FIG. 5D, the sidewall 54 is formed on the side face of the end of each of the upper electrode 61 and the organic photoelectric conversion film 62.

The processing of the upper electrode 61 and the organic photoelectric conversion film 62, the peeling of the resist 112, and the forming of the sidewall 54 described in FIGS. 5C and 5D are performed in-situ (in a state where the vacuum state is maintained).

For example, a parallel-plate type dry etching apparatus is used with an RF power of 500 W, a pressure of 1 Pa, an etching gas of Ar, a flow rate of 100 sccm, and a substrate temperature of 0° C., to physically sputter the underlying insulating film 52, as illustrated in FIG. 6. As a result, the underlying insulating film 52 reattaches to the side face of each of the neighboring upper electrode 61 and organic photoelectric conversion film 62 to form the sidewall 54.

Thereafter, as illustrated in FIG. 5E, a SiN film 113 is deposited over the planar region by, for example, a plasma CVD method. The layered structure including the SiN film 111 and the SiN film 113 corresponds to the sealing film 56 of FIG. 2.

Although illustrations of subsequent steps are omitted, the light-shielding film 57 is formed by using, for example, a photolithographic technique and dry etching. Thereafter, post-treatments such as asking, and cleaning with an organic solvent are performed to remove deposits and residues, and then the sealing film 58 and the on-chip lenses 59 are formed. Finally, the electrode pads are formed in the peripheral circuit unit 21.

The solid-state image pickup element 1 of FIG. 2 is completed through the above steps.

As described above, according to the first manufacturing method of the first embodiment described with reference to FIGS. 4A, 4B, 4C, 4D, 4E, 5A, 5B, 5C, 5D, and 5E, the upper electrode 61 and the organic photoelectric conversion film 62 are processed, and then the sidewall 54 can be formed, in-situ, on the side face of each of the upper electrode 61 and the organic photoelectric conversion film 62. Thus, there is no atmospheric influence on the photoelectric conversion characteristic of the organic photoelectric conversion film 62, thereby resulting in less deterioration of the organic photoelectric conversion film 62.

Therefore, according to the first embodiment of the solid-state image pickup element 1, there can be inhibited a variation in the photoelectric conversion characteristic of the organic photoelectric conversion film 62 due to atmospheric exposure.

<Second Manufacturing Method>

Next, with reference to FIGS. 7A, 7B, 7C, 7D, 7E, and 7F, a second manufacturing method of the first embodiment will be described.

For the above-described first manufacturing method, the CMP dummy film 55 is formed in advance. Thereafter, each lower electrode 63 is formed.

On the other hand, the second manufacturing method described below is a manufacturing method in which each lower electrode 63 is formed in advance, and then a CMP dummy film 55 is formed.

Figure 7A:
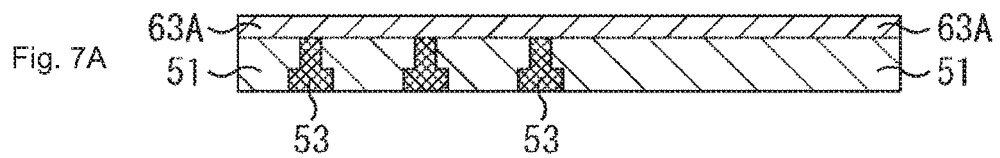
FIGS. 7A, 7B, 7C, 7D, 7E, and 7F are explanatory view of a second manufacturing method of the first embodiment.

Specifically, as illustrated in FIG. 7A, an insulating film 51 and metallic wires 53 are formed on the light-irradiation face side of a semiconductor substrate 12, and then a material serving as each lower electrode 63, for example, ITO 63A is deposited by a sputtering method, on the respective upper faces of the insulating film 51 and metallic wires 53.

Figure 7B:
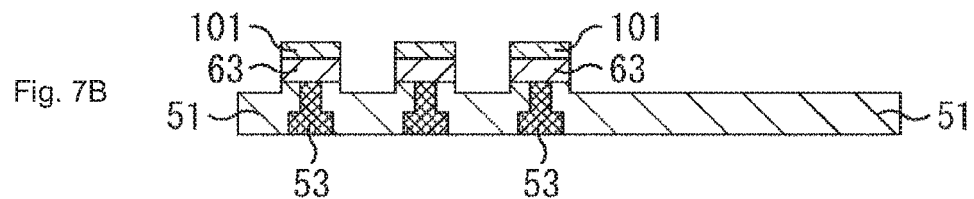

Then, as illustrated in FIG. 7B, an oxide film (SiO2) 101 formed on the upper face of the ITO 63A is patterned such that only a portion for forming each lower electrode 63 remains. Thereafter, the ITO 63A is processed by dry etching or wet etching. The portion remains after the etching of the ITO 63A serves as each lower electrode 63 formed in units of pixels.

Figure 7C:
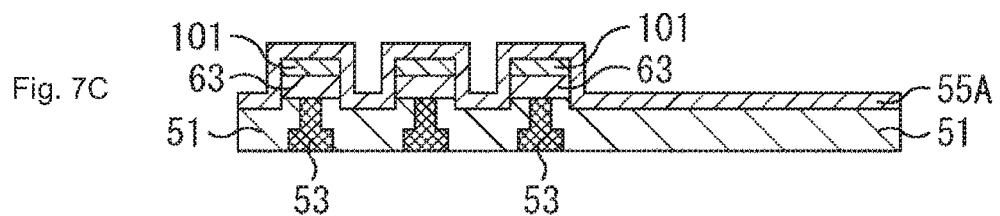
Figure 7D:
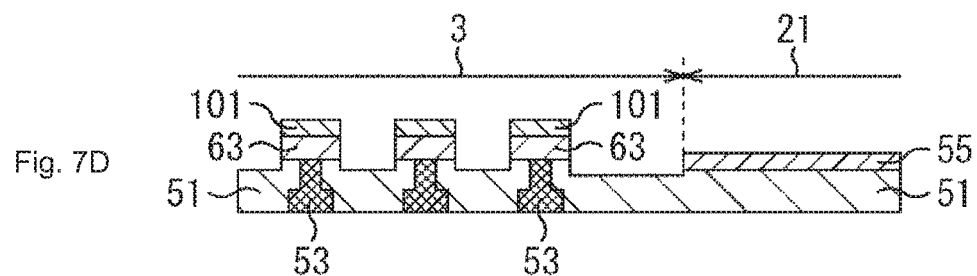

Next, as illustrated in FIG. 7C, a material serving as a CMP dummy film 55, for example, a SiN film 55A, is deposited over the planar region by a CVD method. Thereafter, as illustrated in FIG. 7D, a photolithographic technique and dry etching are used to remove the SiN film 55A in the region of a pixel array unit 3. As a result, the CMP dummy film 55 is formed in a peripheral circuit unit 21 outside the pixel array unit 3. In FIG. 7D, the height of the upper face of the CMP dummy film 55 is formed to be lower than the height of the respective upper faces of the lower electrodes 63.

Figure 7E:
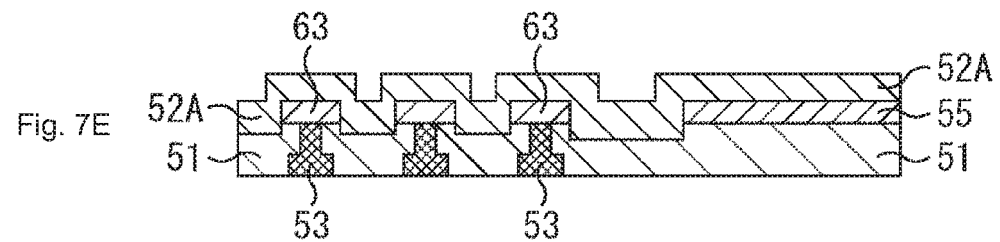
Figure 7F:
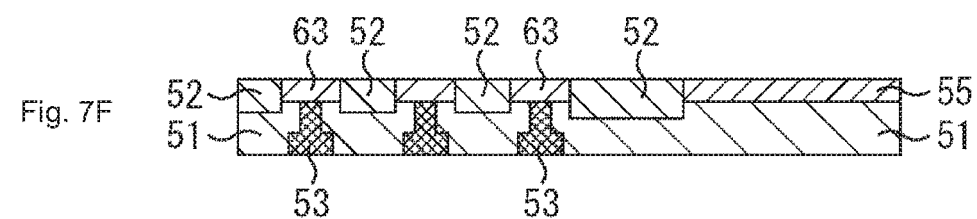

The steps in E and F of FIGS. 7E and 7F are similar to the steps in FIGS. 4D and 4E in the first manufacturing method. In other words, an insulating film 52A such as a SiO2 film is deposited over the respective upper faces of the lower electrodes 63 and CMP dummy film 55, and then, for example, planarization treatment by CMP is performed to expose the lower electrodes 63 and the CMP dummy film 55.

Since the manufacturing method after the step in FIG. 7F is similar to the first manufacturing method described with reference to of FIGS. 5A, 5B, 5C, 5D, and 5E, the description will be omitted.

Therefore, in the second manufacturing method of the first embodiment as well, the upper electrode 61 and the organic photoelectric conversion film 62 are processed, and then the sidewall 54 can be formed, in-situ, on the side face of each of the upper electrode 61 and the organic photoelectric conversion film 62. Thus, there is no atmospheric influence on the photoelectric conversion characteristic of the organic photoelectric conversion film 62, thereby resulting in less deterioration of the organic photoelectric conversion film 62. Therefore, there can be inhibited a variation in the photoelectric conversion characteristic of the organic photoelectric conversion film 62 due to atmospheric exposure.

<Effect of CMP Dummy Film 55>

Next, the effect of the CMP dummy film 55 will be described with reference to FIG. 8.

Figure 8:
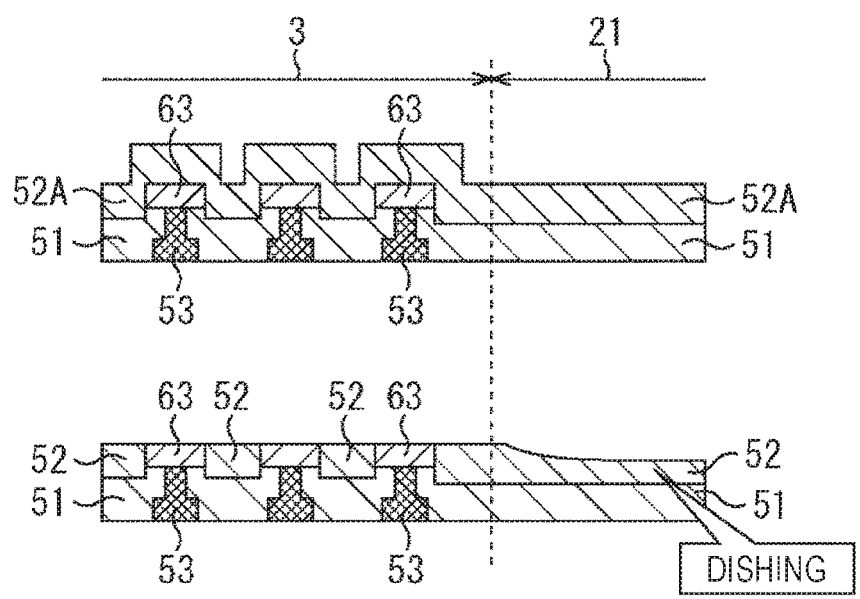
FIG. 8 is an explanatory view of effects of the CMP dummy film.

As illustrated in FIG. 8, without a structure including the CMP dummy film 55 formed in the peripheral circuit unit 21 outside the pixel array unit 3, in a case where planarization treatment is performed by CMP until the lower electrodes 63 are exposed, dishing (dent) occurs on an insulating film 52 in the peripheral circuit unit 21. This dishing deteriorates the planarity, and reduces the yield of the solid-state image pickup element.

Like the solid-state image pickup element 1 of the present disclosure, adoption of the structure including the CMP dummy film 55 formed in the peripheral circuit unit 21 outside the pixel array unit 3 reduces CMP dishing at the peripheral circuit unit 21 to improve the planarity in structure.

As a material of the CMP dummy film 55, there is used a material having a CMP polishing rate lower than the CMP polishing rate of the insulating film 52 buried between each lower electrodes 63. Example of the material of the insulating films 52 to be used include SiO, SiON, and the like and examples of the material of the CMP dummy film 55 to be used include SiN, SiON, SiCO, SiCN, SiCNO, and the like. Both the insulating films 52 and the CMP dummy film 55 may contain SiON, and in that case, SiON in the CMP dummy film 55 may have a smaller ratio of oxygen (O).

3. Second Embodiment

<Cross-Sectional Structure>

Figure 9:
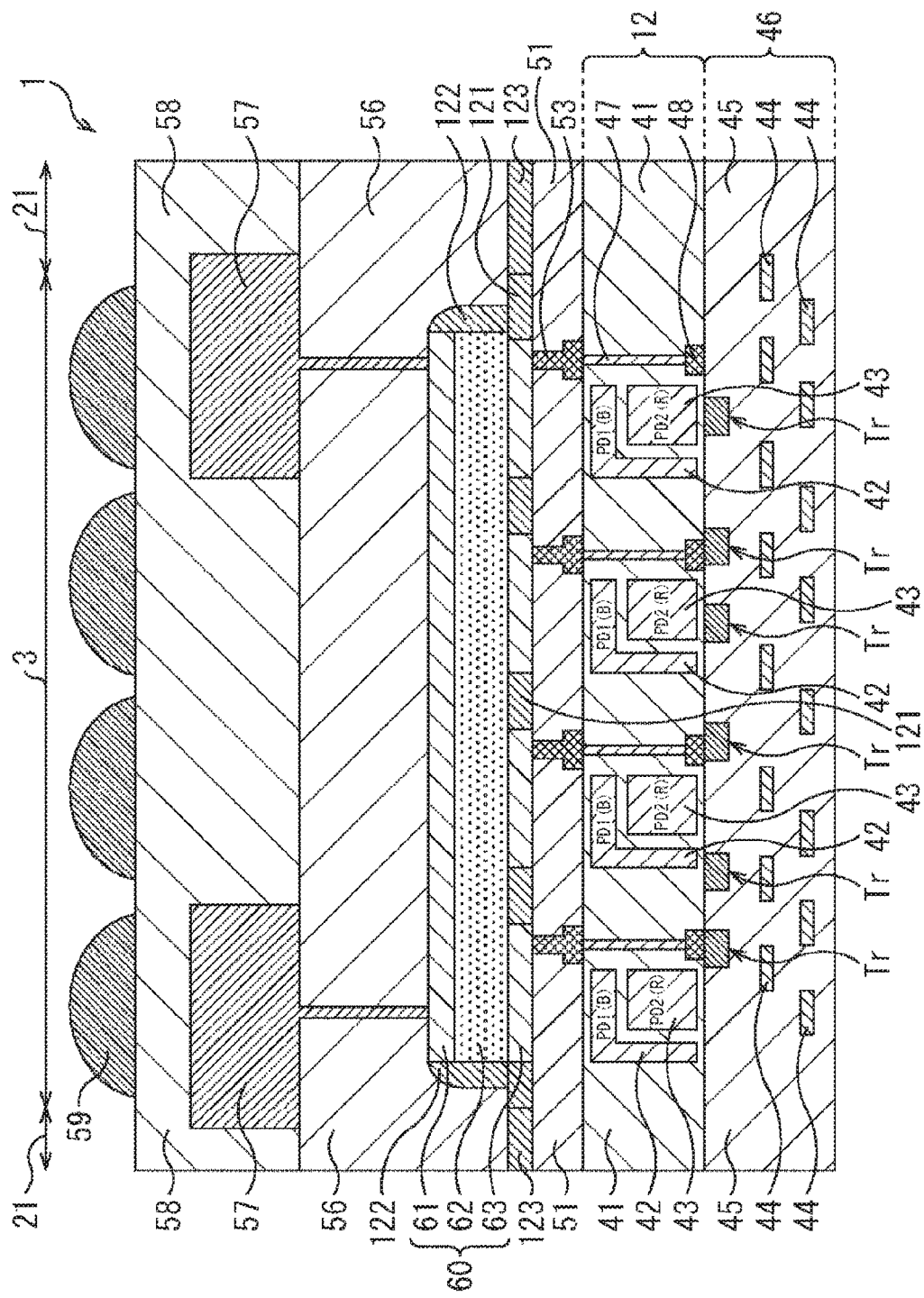
FIG. 9 is a view of a cross-sectional structure according to a second embodiment of the solid-state image pickup element.

FIG. 9 is a view of a cross-sectional structure according to a second embodiment of the solid-state image pickup element 1.

Note that, in FIG. 9, the same reference numerals are given to elements common to the above-described first embodiment, and the description of the elements will be omitted appropriately.

In the second embodiment illustrated in FIG. 9, the insulating films 52, the sidewall 54, and the CMP dummy film 55 of the first embodiment illustrated in FIG. 2 are replaced with insulating films 121, a sidewall 122, and a CMP dummy film 123.

In the second embodiment, a material with high sealability is used as a material of an insulating film 121 between each lower electrode 63 formed separately in units of pixels. As a result, the sidewall 122 formed by physically sputtering an underlying insulating film 121 also includes a material identical to the material of the insulating film 121. Furthermore, a material identical to the material of the insulating films 121 is also used as a material of the CMP dummy film 123 in a peripheral circuit unit 21, the CMP dummy film 123 in a layer identical to a layer including the insulating film 121 between each lower electrode 63.

Examples of such materials with high sealability that can be used include SiCO, AlO, AlN, SiN, SiON, SiCN, SiCNO, and the like. The insulating films 121 and the CMP dummy film 123 can be simultaneously deposited by using a remote plasma CVD method, an ALD method, a CVD method, a PVD method, or the like.

For the method of manufacturing a solid-state image pickup element 1 according to the second embodiment, it is sufficient if a formed SiN film 55A remains not only in the peripheral circuit unit 21 but also between each lower electrode 63, in the dry etching process of FIG. 7D of the second manufacturing method of the first embodiment described above, for example.

In the manufacturing method of the second embodiment as well, an upper electrode 61 and an organic photoelectric conversion film 62 are processed, and then a sidewall 54 can be formed, in-situ, on the side face of each of the upper electrode 61 and the organic photoelectric conversion film 62. Thus, there is no atmospheric influence on the photoelectric conversion characteristic of the organic photoelectric conversion film 62, thereby resulting in less deterioration of the organic photoelectric conversion film 62. Therefore, there can be inhibited a variation in the photoelectric conversion characteristic of the organic photoelectric conversion film 62 due to atmospheric exposure.

Furthermore, according to the second embodiment, a material with high sealability is used as the insulating film 121 directly under the sidewall 122 to form the sidewall 122. Thus, the sidewall 122 further improves the sealability of the organic photoelectric conversion film 62, thereby further inhibiting a variation in the photoelectric conversion characteristic of the organic photoelectric conversion film 62.

Furthermore, in the second embodiment as well, providing of the CMP dummy film 123 in the peripheral circuit unit 21 outside the pixel array unit 3 reduces CMP dishing to improve the planarity in structure that results in yield improvement.

4. Third Embodiment

<Cross-Sectional Structure>

Figure 10:
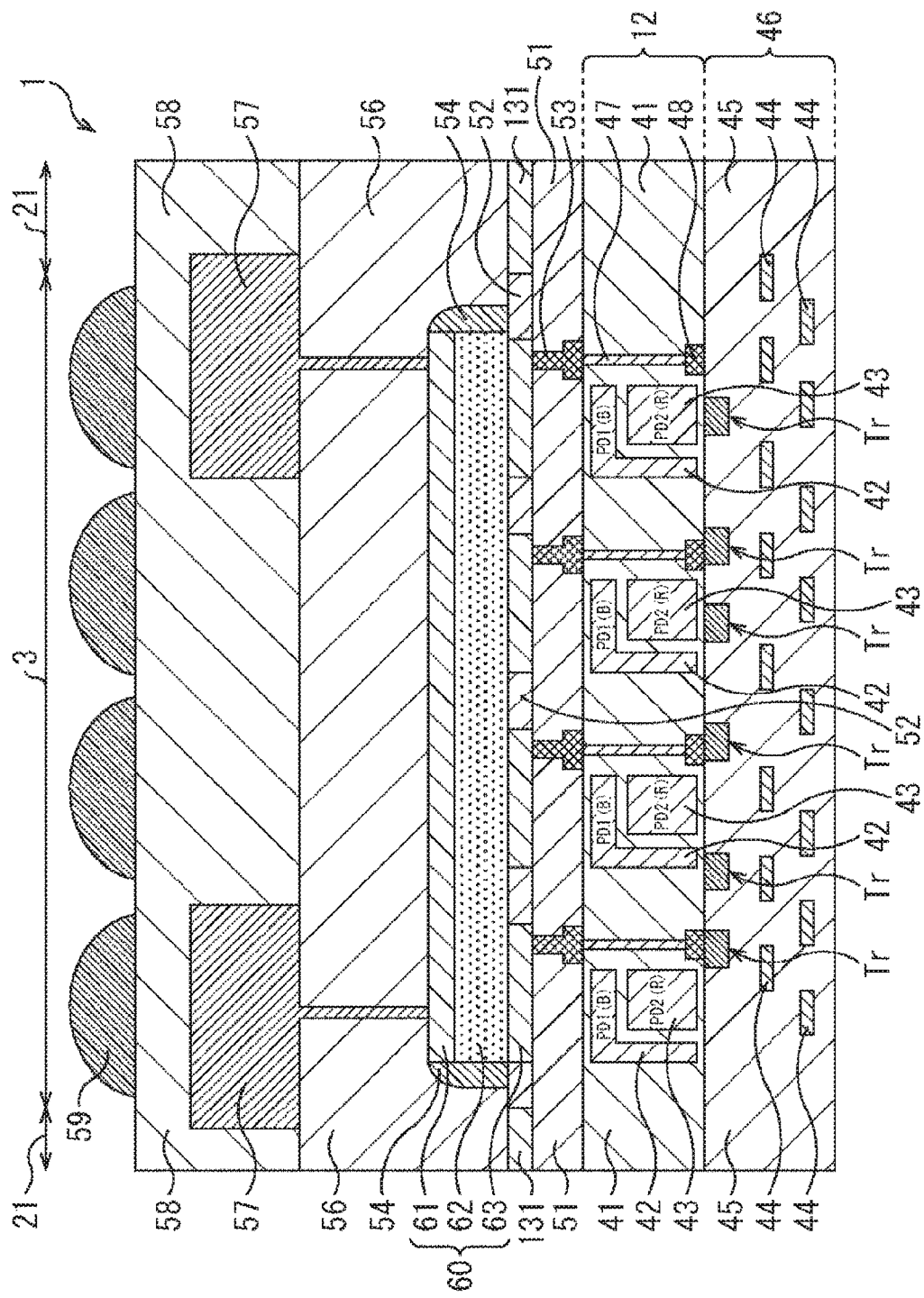
FIG. 10 is a view of a cross-sectional structure according to a third embodiment of the solid-state image pickup element.

FIG. 10 is a view of a cross-sectional structure according to a third embodiment of the solid-state image pickup element 1.

In FIG. 10 as well, the same reference numerals are given to elements common to the above-described first embodiment, and the description of the elements will be omitted appropriately.

In the third embodiment illustrated in FIG. 10, the CMP dummy film 55 of the first embodiment illustrated in FIG. 2 is replaced with a CMP dummy film 131 formed using a material identical to a material of a lower electrode 63. In other words, the CMP dummy film 131 of the third embodiment is formed, for example, using a material such as ITO or IZO. Other configurations are similar to those in the first embodiment.

<Manufacturing Method>

Next, with reference to FIGS. 11A, 11B, 11C, and 11D, a manufacturing method of the third embodiment will be described.

Figure 11:
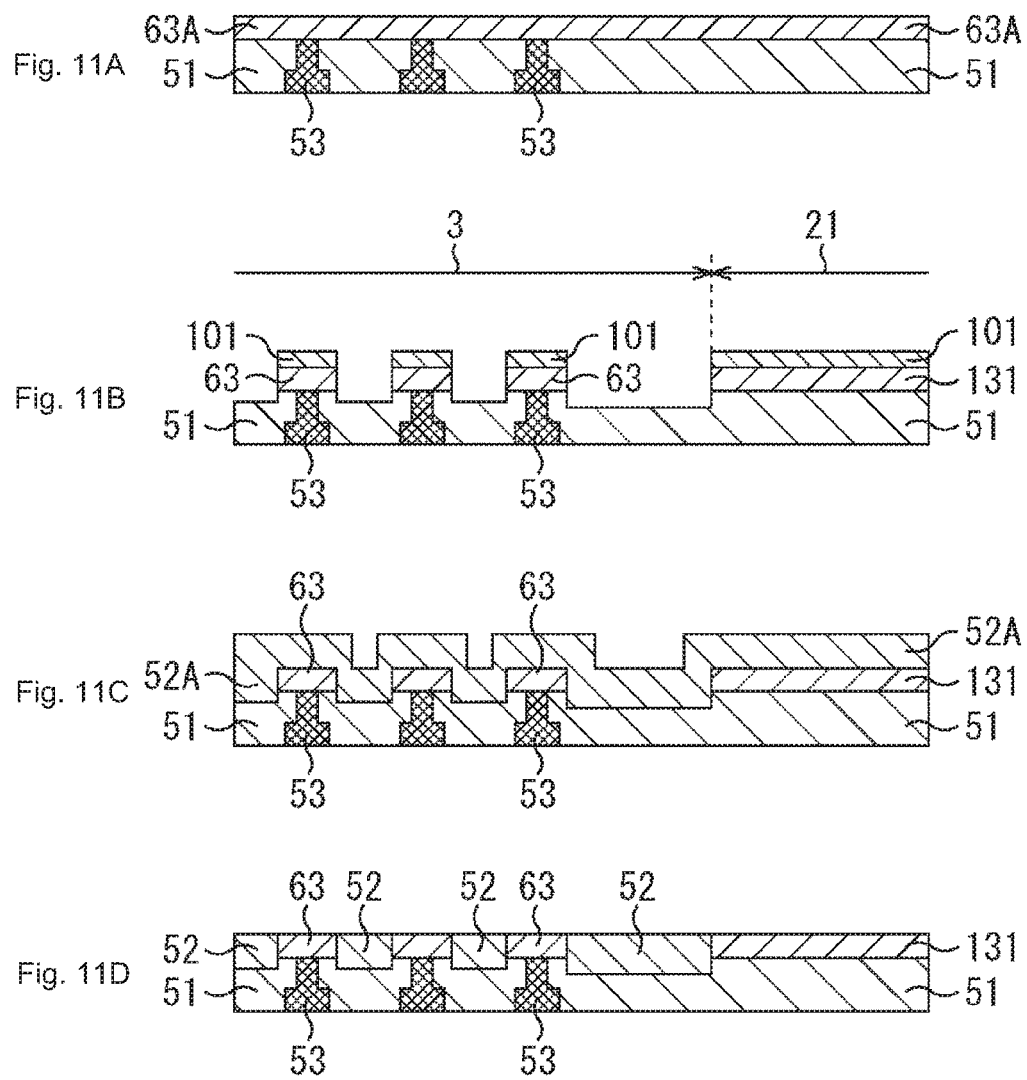
FIGS. 11A, 11B, 11C, and 11D are explanatory view of a manufacturing method of the third embodiment.

First, as illustrated in FIG. 11A, an insulating film 51 and metallic wires 53 are formed on the light-irradiation face side of a semiconductor substrate 12, and then a material of lower electrodes 63 and the CMP dummy film 131, for example, ITO 63A is deposited by a sputtering method, on the respective upper faces of the insulating film 51 and metallic wires 53.

Then, as illustrated in FIG. 11B, an oxide film (SiO2) 101 formed on the upper face of ITO 63A is patterned, and the ITO 63A is processed by dry etching or wet etching. In the ITO 63A after the etching, upper portions of the metallic wires 53 respectively serve as lower electrodes 63, and the region of a peripheral circuit unit 21 serves as the CMP dummy film 131.

Next, as illustrated in FIG. 11C, an insulating film 52A such as a SiO2 film is deposited over the planar region. Then, planarization treatment is performed by, for example, CMP, and the insulating film 52A is polished until the lower electrodes 63 and the CMP dummy film 131 are exposed. As a result, as illustrated in FIG. 11D, an insulating film 52 is buried between each lower electrodes 63.

Since the manufacturing method after the step in FIG. 11D is similar to the first manufacturing method of the first embodiment described with reference to FIGS. 5A, 5B, 5C, 5D, and 5E, the description will be omitted.

As described above, in the manufacturing method of the third embodiment, the CMP dummy film 131 is formed simultaneously with the lower electrodes 63 by using the material of the lower electrodes 63. In the manufacturing method of the third embodiment as well, an upper electrode 61 and an organic photoelectric conversion film 62 are processed, and then a sidewall 54 can be formed, in-situ, on the side face of each of the upper electrode 61 and the organic photoelectric conversion film 62. Thus, there is no atmospheric influence on the photoelectric conversion characteristic of the organic photoelectric conversion film 62, thereby resulting in less deterioration of the organic photoelectric conversion film 62. Therefore, there can be inhibited a variation in the photoelectric conversion characteristic of the organic photoelectric conversion film 62 due to atmospheric exposure.

Furthermore, in the third embodiment as well, providing of the CMP dummy film 131 in the peripheral circuit unit 21 outside the pixel array unit 3 reduces CMP dishing to improve the planarity in structure that results in yield improvement.

5. Fourth Embodiment

<Cross-Sectional Structure>

Figure 12:
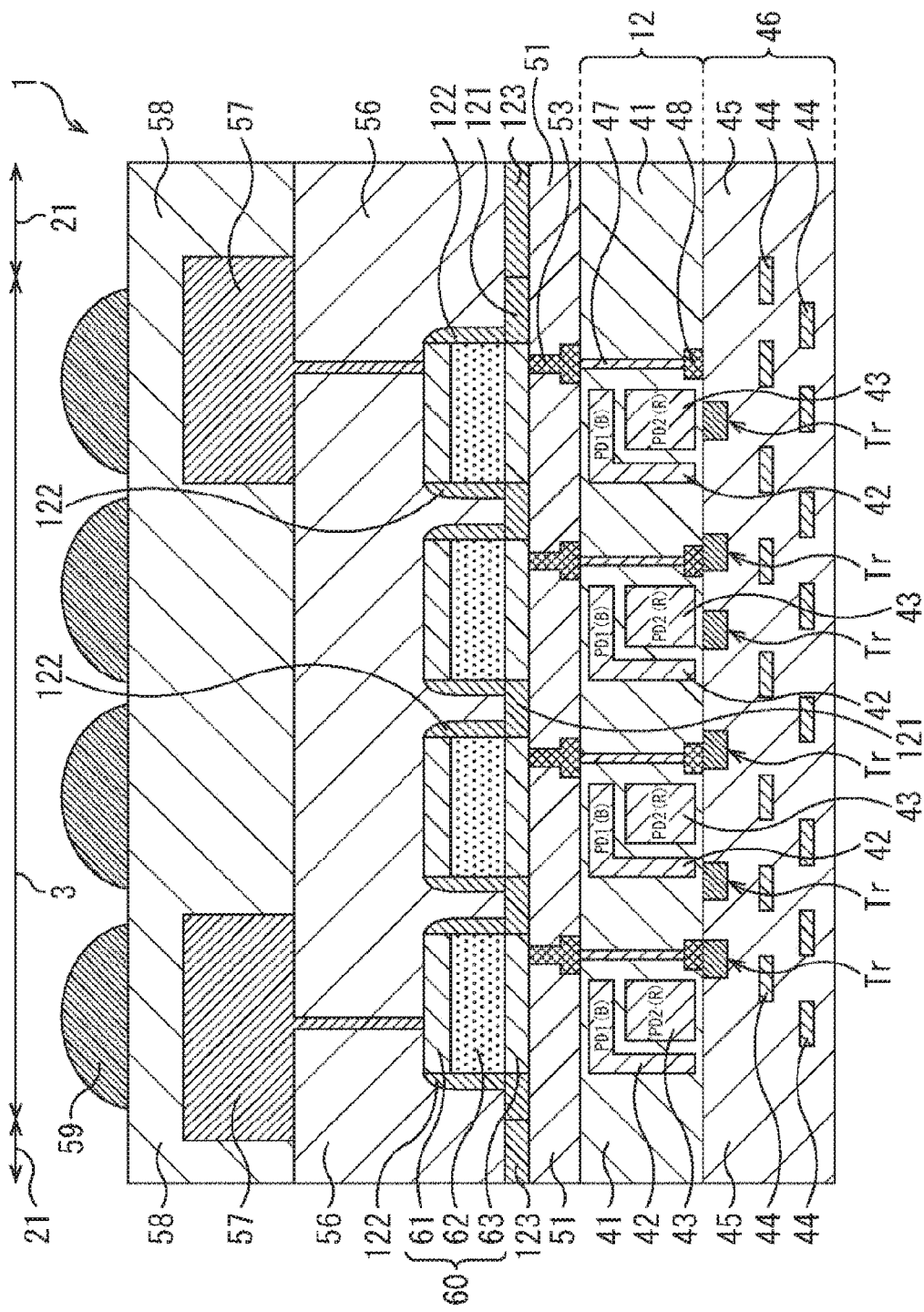
FIG. 12 is a view of a cross-sectional structure according to a fourth embodiment of the solid-state image pickup element.

FIG. 12 is a view of a cross-sectional structure according to a fourth embodiment of the solid-state image pickup element 1.

Note that the fourth embodiment will be described in comparison with the second embodiment illustrated in FIG. 9. In FIG. 12, the same reference numerals are given to elements common to the second embodiment illustrated in FIG. 9, and the description of the elements will be omitted appropriately.

The second embodiment illustrate in FIG. 9 has the structure in which only the lower electrodes 63 among the upper electrode 61, the organic photoelectric conversion film 62, and the lower electrodes 63 included in the photoelectric conversion unit 60 are separated for each pixel.

On the other hand, a solid-state image pickup element 1 of the fourth embodiment illustrated in FIG. 12, has a structure in which an upper electrode 61, an organic photoelectric conversion film 62, and a lower electrode 63 are all separated for each pixel. Furthermore, along with this arrangement, a sidewall 122 is formed on both side faces of each of the upper electrode 61 and the organic photoelectric conversion film 62 separated for each pixel.

For the manufacturing method of the fourth embodiment, patterning of a resist 112 as illustrated in FIG. 5B is formed in units of pixels similarly to the lower electrodes 63. Such forming also enables separately forming of the upper electrode 61 and the organic photoelectric conversion film 62 for each pixel. The fourth embodiment is similar to the above-described first embodiment in that the upper electrode 61 and the organic photoelectric conversion film 62 are processed and then each sidewall 122 is formed, in-situ, on the side face of each of upper electrode 61 and the organic photoelectric conversion film 62.

Therefore, the solid-state image pickup element 1 according to the fourth embodiment includes the sidewall 122, whereby there can be inhibited a variation in the photoelectric conversion characteristic of the organic photoelectric conversion film 62 due to atmospheric exposure.

Furthermore, providing of a CMP dummy film 123 in a peripheral circuit unit 21 outside a pixel array unit 3 reduces CMP dishing to improve the planarity in structure that results in yield improvement.

Note that the fourth embodiment has the structure in which the upper electrode 61 and the organic photoelectric conversion film 62 of the second embodiment are divided into units of pixels. Similarly, the fourth embodiment can also have a structure in which the upper electrode 61 and the organic photoelectric conversion film 62 of each of the first embodiment and the third embodiment are divided into units of pixels.

6. Examples Applicable to Electronic Devices

The technology of the present disclosure is not limited to application to a solid-state image pickup element. In other words, the technology of the present disclosure is applicable to electronic devices in general including a solid-state pickup element in an image receiving unit (photoelectric conversion unit), an image pickup device such as a digital still camera or a video camera, a mobile terminal device having an imaging function, a copying machine including a solid-state image pickup element in an image reading unit, or the like. The solid-state image pickup element may be in a form formed as a single chip or in a modular form having an imaging function in which an image pickup unit and a signal processing unit or an optical system are packaged together.

Figure 13:
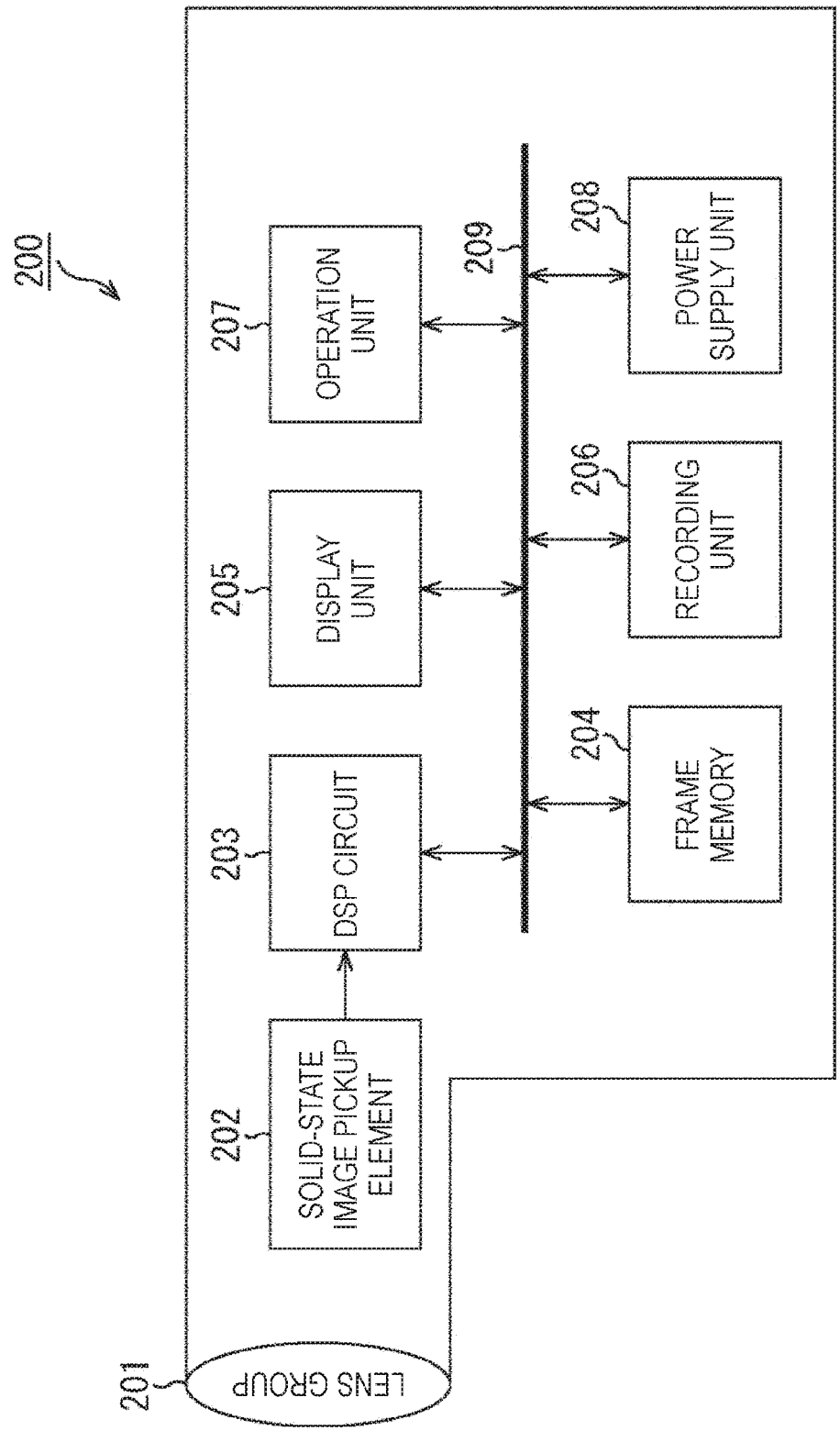
FIG. 13 is a block diagram of a configuration example of an image pickup device serving as an electronic device to which the technology of the present disclosure is applied.

FIG. 13 is a block diagram of a configuration example of an image pickup device serving as an electronic device to which the technology of the present disclosure is applied.

An image pickup device 200 of FIG. 13 includes: an optical unit 201 including a lens group and the like; a solid-state image pickup element (image pickup device) 202 with the configuration of the solid-state image pickup element 1 of FIG. 1 adopted; and a digital signal processor (DSP) circuit 203 serving as a camera signal processing circuit. Furthermore, the image pickup device 200 also includes a frame memory 204, a display unit 205, a recording unit 206, an operation unit 207, and a power supply unit 208. The DSP circuit 203, the frame memory 204, the display unit 205, the recording unit 206, the operation unit 207, and the power supply unit 208 are mutually connected through a bus line 209.

The optical unit 201 receives incident light (optical image) from a subject to form an image on the image pickup face of the solid-state image pickup element 202. The solid-state image pickup element 202 converts the amount of incident light for the image formed on the image pickup face by the optical unit 201 into an electrical signal in units of pixels, and outputs the electrical signal as a pixel signal. Providing of the solid-state image pickup element 1 according to each of the above-described embodiments as the solid-state image pickup element 202, in other words, providing of the sidewall 54 or 122 enables inhibition of a variation in the photoelectric conversion characteristic of the organic photoelectric conversion film 62, and providing of the CMP dummy film 55, 123, or 131 enables use of a solid-state image pickup element in which the planarity in structure is improved.

The display unit 205 includes, for example, a thin display such as a liquid crystal display (LCD) or an organic electro luminescence (EL) display, and displays a moving image or a still image captured by the solid-state image pickup element 202. The recording unit 206 records the moving image or the still image captured by the solid-state image pickup element 202 onto a recording medium such as a hard disk or a semiconductor memory.

The operation unit 207 issues an operation command for various functions of the image pickup device 200, under the operation of the user. The power supply unit 208 appropriately supplies various power sources to be operation power sources of the DSP circuit 203, the frame memory 204, the display unit 205, the recording unit 206, and the operation unit 207, to these units of interest.

As described above, the use of the solid-state image pickup element 1 according to each of the above-described embodiments as the solid-state image pickup element 202 improves the image quality of captured images. Accordingly, even for the image pickup device 200 such as a video camera, a digital still camera, or a camera module for a mobile device such as a mobile phone, there can be improved the image quality of captured images.

<Examples of Use of Image Sensor>

Figure 14:
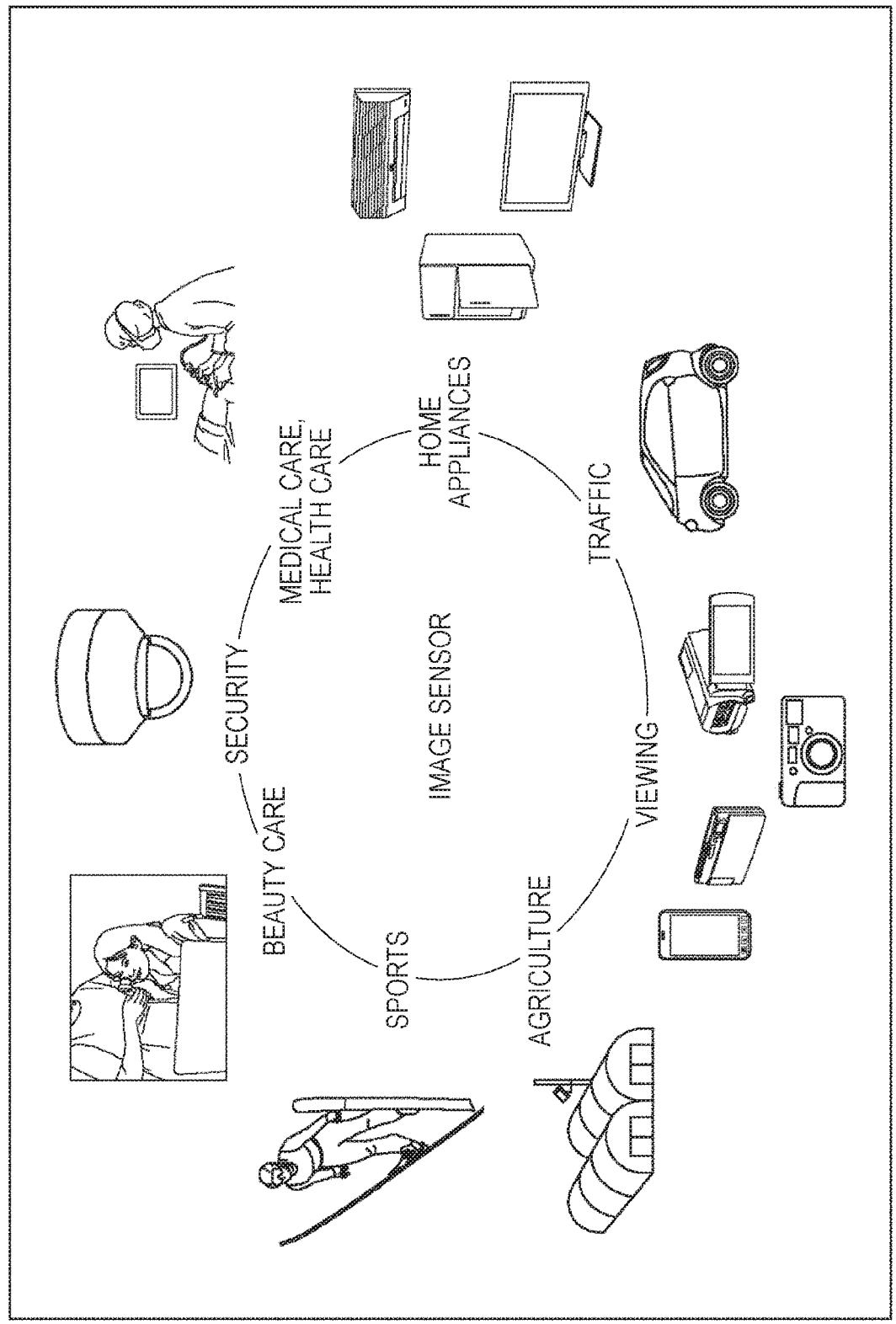
FIG. 14 is an explanatory view of examples of use of an image sensor.

FIG. 14 is an explanatory view of examples of use of an image sensor including the above-described solid-state image pickup element 1.

The image sensor including the above-described solid-state image pickup element 1 can be used in various cases for sensing light such as visible light, infrared light, ultraviolet light, or X-rays as described below, for example.

- Devices for shooting an image to be provided for viewing, such as digital cameras and portable devices with a camera function
- Devices to be provided for traffic, such as: on-board vehicle sensors for shooting the front, rear, around, or inside of an automobile for safe driving including automatic stop and for recognition of driver's state or the like; surveillance cameras for surveilling traveling vehicles and roads; and distance sensors and the like for measuring between vehicles and the like
- Devices to be provided for home appliances such as TVs, refrigerators, and air conditioners, in order to shoot the user's gesture and operate such an appliance in response to the gesture
- Devices to be provided for medical care and health care, such as endoscopes and devices for angiography by receiving infrared light
- Devices to be provided for security, such as surveillance cameras for crime prevention applications and cameras for person authentication applications
- Devices to be provided for beauty care, such as skin measuring instruments for shooting a skin and microscopes for shooting a scalp
- Devices to be provided for sports, such as action cameras and wearable cameras for sports applications or the like
- Devices to be provided for agriculture, such as cameras for monitoring the state of fields and crops 7. Application Examples to Movable-Object Control System The technology according to the present disclosure is applicable to various products. For example, the technology according to the present disclosure may be provided as an apparatus with which any type of movable objects is to be equipped, such as an automobile, electric vehicle, hybrid electric vehicle, motorcycle, bicycle, personal mobility, airplane, drone, ship, robot, construction machine, agricultural machine (tractor).

Figure 15:
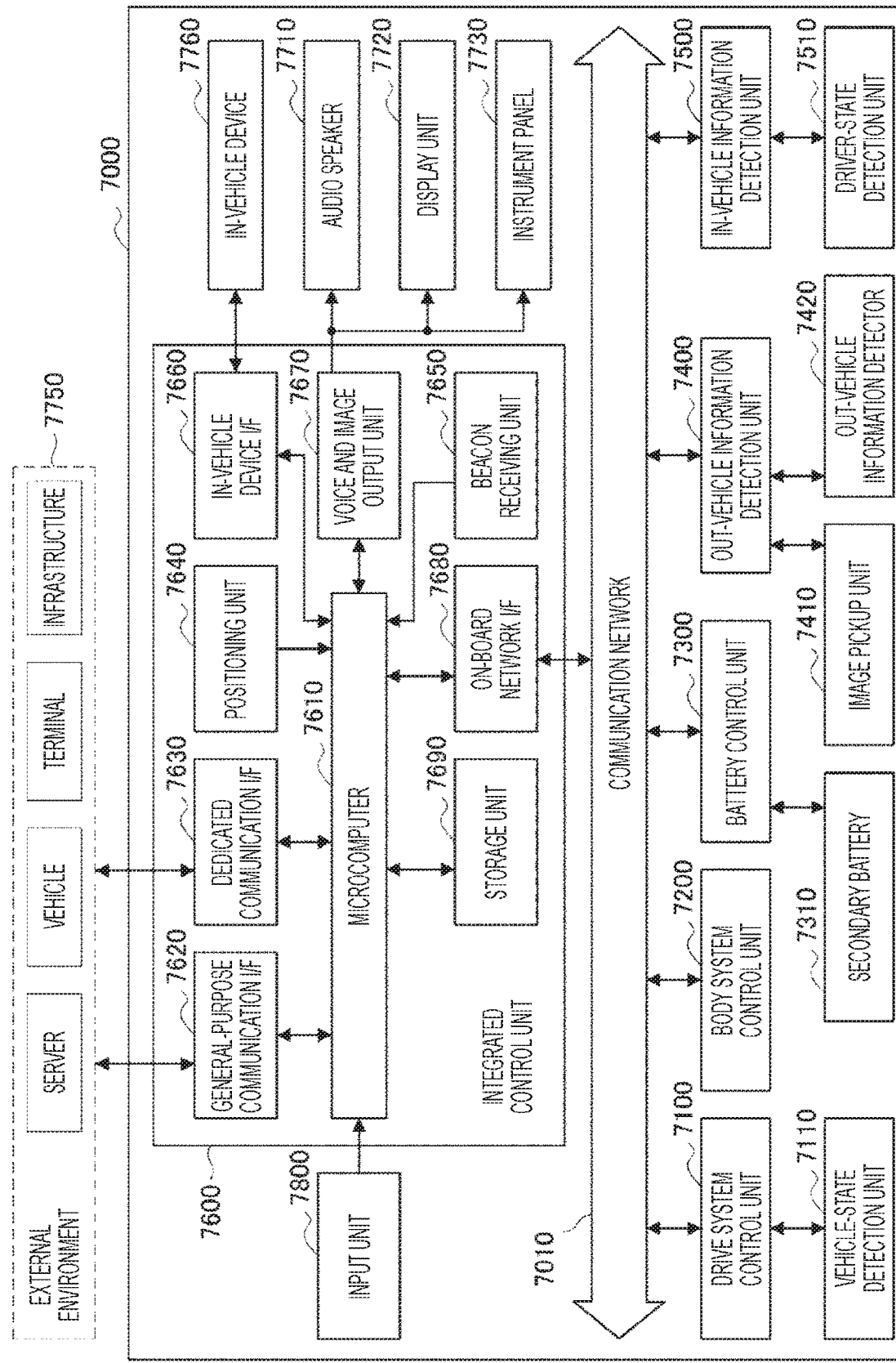
FIG. 15 is a block diagram of a schematic configuration example of a vehicle control system.

FIG. 15 is a block diagram of a schematic configuration example of a vehicle control system 7000 as an example of a movable-object control system to which the technology according to the present disclosure is applicable. The vehicle control system 7000 includes a plurality of electronic control units connected through a communication network 7010. In the example illustrated in FIG. 15, the vehicle control system 7000 includes: a drive system control unit 7100; a body system control unit 7200; a battery control unit 7300; an out-vehicle information detection unit 7400; an in-vehicle information detection unit 7500; and an integrated control unit 7600. The communication network 7010 for connecting the plurality of control units may be, for example, an on-board communication network conforming to any standard such as controller area network (CAN), local interconnect network (LIN), local area network (LAN), or FlexRay (registered trademark).

The control units each include: a microcomputer that performs computing processing in accordance with various programs; a storage unit that stores a program to be executed by the microcomputer, a parameter to be used for various types of computing, or the like; and a drive circuit that drives devices to be controlled variously. In addition to a network I/F for communicating with a different control unit through the communication network 7010, the control units each include a communication I/F for communicating with in-vehicle or out-vehicle devices, or in-vehicle or out-vehicle sensors and the like, through wired communication or wireless communication. As a functional configuration of the integrated control unit 7600, FIG. 15 illustrates a microcomputer 7610, a general-purpose communication I/F 7620, a dedicated communication I/F 7630, a positioning unit 7640, a beacon receiving unit 7650, an in-vehicle device I/F 7660, a voice and image output unit 7670, an on-board network I/F 7680, and a storage unit 7690. Similarly, the other control units each include a microcomputer, a communication I/F, a storage unit, and the like.

The drive system control unit 7100 controls the operation of a device related to the drive system of a vehicle, in accordance with various programs. For example, the drive system control unit 7100 functions as a control device such as: a driving force generating device that generates a driving force of the vehicle, such as an internal combustion engine or a driving motor; a driving force transmitting mechanism that transmits the driving force to the wheels; a steering mechanism that adjusts a steering angle of the vehicle; and a braking device that generates a braking force of the vehicle. The drive system control unit 7100 may have a function as a control device such as an antilock brake system (ABS) or an electronic stability control (ESC).

A vehicle-state detection unit 7110 is connected to the drive system control unit 7100. For example, the vehicle-state detection unit 7110 includes at least one of a gyro sensor that detects the angular velocity of the shaft rotational motion of the vehicle body, an acceleration sensor that detects the acceleration of the vehicle, or a sensor that detects the operation amount of the accelerator pedal, the operation amount of the brake pedal, a steering angle of the steering wheel, the number of revolution of the engine, the rotation speed of the wheels, or the like. The drive system control unit 7100 performs computing processing with a signal input from the vehicle-state detection unit 7110 to control the internal combustion engine, the driving motor, an electric power steering device, a brake device, or the like.

The body system control unit 7200 controls the operation of the various devices with which the vehicle body is equipped, in accordance with various programs. For example, the body system control unit 7200 functions as a keyless entry system, a smart key system, a power window device, or a control device for various lamps such as a head lamp, a back-up lamp, a brake lamp, a direction indicator, or a fog lamp. In this case, the body system control unit 7200 is capable of receiving radio waves as an input, transmitted from a portable device that substitutes a key, or signals of various switches as an input. The body system control unit 7200 receives these radio waves or signals as an input, and controls the door lock device, power window device, lamps, and the like of the vehicle.

The battery control unit 7300 controls a secondary battery 7310 serving as a power supply source of the driving motor, in accordance with various programs. For example, there are input into the battery control unit 7300, information regarding battery temperature, battery output voltage, battery remaining capacity or the like, from a battery device including the secondary battery 7310. The battery control unit 7300 performs computing processing with these signals to control the temperature adjustment of the secondary battery 7310 or a cooling device or the like included in the battery device.

The out-vehicle information detection unit 7400 detects information regarding the outside of the vehicle equipped with the vehicle control system 7000. For example, at least one of an image pickup unit 7410 or an out-vehicle information detector 7420 is connected to the out-vehicle information detection unit 7400. The image pickup unit 7410 includes at least one of a time of flight (ToF) camera, a stereo camera, a single-eye camera, an infrared camera, or a different camera. The out-vehicle information detector 7420 includes, for example, at least one of an environmental sensor for detecting the current weather or climate, or a peripheral information detection sensor for detecting another vehicle, an obstacle, a pedestrian, or the like in the periphery of the vehicle equipped with the vehicle control system 7000.

The environmental sensor may be, for example, at least one of a raindrop sensor for detecting rainy weather, a fog sensor for detecting fog, a sunlight sensor for detecting sunlight degree, or a snow sensor for detecting snowfall. The peripheral information detection sensor may be at least one of an ultrasonic sensor, a radar device, or a light detection and ranging, laser imaging detection and ranging (LIDAR) device. Each of the image pickup unit 7410 and the out-vehicle information detector 7420 may be provided as an independent sensor or device, or may be provided as a device in which a plurality of sensors or a plurality of devices is unified.

Figure 16:
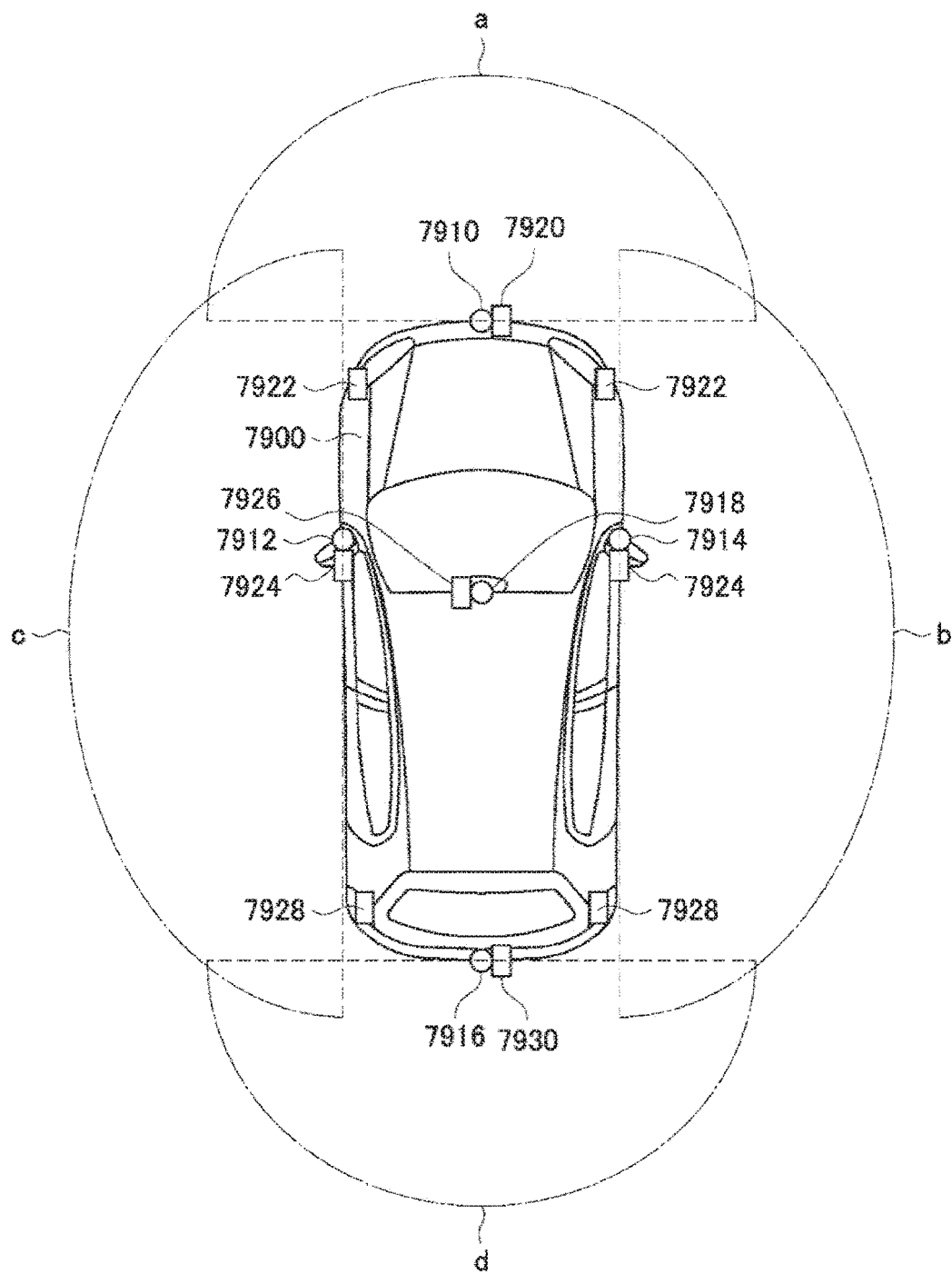
FIG. 16 is an explanatory view of an example of installation positions of an out-vehicle information detector and an image pickup unit.

Here, FIG. 16 exemplifies the installation positions of the image pickup unit 7410 and the out-vehicle information detector 7420. Image pickup units 7910, 7912, 7914, 7916, and 7918 are provided, for example, at least one position of a front nose, a side mirror, a rear bumper, a back door, or an upper portion of a windshield in the vehicle compartment, of a vehicle 7900. The image pickup unit 7910 provided at the front nose and the image pickup unit 7918 provided at the upper portion of the windshield in the vehicle compartment mainly acquire an image ahead of the vehicle 7900. The image pickup units 7912 and 7914 provided at the side mirrors mainly acquire lateral images of the vehicle 7900. The image pickup unit 7916 provided at the rear bumper or the back door mainly acquires an image behind the vehicle 7900. The image pickup unit 7918 provided at the upper portion of the windshield in the vehicle compartment is mainly used for detecting a vehicle in front, a pedestrian, an obstacle, a traffic signal, a traffic sign, a lane, or the like.

Note that, FIG. 16 illustrates an example of the respective shooting ranges of the image pickup units 7910, 7912, 7914, and 7916. A capturing range a indicates the capturing range of the image pickup unit 7910 provided at the front nose, capturing ranges b and c indicate the respective capturing ranges of the image pickup units 7912 and 7914 provided at the side mirrors, and a capturing range d indicates the capturing range of the image pickup unit 7916 provided at the rear bumper or the back door. For example, pieces of data of images captured by the image pickup units 7910, 7912, 7914, and 7916 are superposed to obtain an overhead view image of the vehicle 7900 viewed from above.

The out-vehicle information detectors 7920, 7922, 7924, 7926, 7928, and 7930 provided at the front, rear, side, corner, and upper portion of the windshield in the vehicle compartment, of the vehicle 7900 may be ultrasonic sensors or radar devices, for example. The out-vehicle information detectors 7920, 7926, and 7930 provided at the front nose, rear bumper, back door, and upper portion of the windshield in the vehicle compartment, of the vehicle 7900, may be LIDAR devices, for example. These out-vehicle information detectors 7920 to 7930 are mainly used for detecting a vehicle in front, a pedestrian, an obstacle, or the like.

Referring back to FIG. 15, the description will be continued. The out-vehicle information detection unit 7400 causes the image pickup unit 7410 to capture an out-vehicle image, and receives the captured image data. Furthermore, the out-vehicle information detection unit 7400 receives detection information from the out-vehicle information detector 7420 in connection with the out-vehicle information detection unit 7400. In a case where the out-vehicle information detector 7420 is an ultrasonic sensor, a radar device, or a LIDAR device, the out-vehicle information detection unit 7400 transmits ultrasonic waves, electromagnetic waves, or the like, and receives information regarding received reflected waves. The out-vehicle information detection unit 7400 may perform, on the basis of the received information, object detection processing or distance detection processing on a person, an automobile, an obstacle, a sign, a character on a road face, or the like. The out-vehicle information detection unit 7400 may perform environment recognition processing for recognizing rainfall, fog, road face condition, or the like, on the basis of the received information. The out-vehicle information detection unit 7400 may calculate the distance to an out-vehicle object, on the basis of the received information.

Furthermore, the out-vehicle information detection unit 7400 may perform, on the basis of the received image data, image recognition processing for recognizing a person, an automobile, an obstacle, a sign, a character on a road face, or the like, or distance detection processing thereon. The out-vehicle information detection unit 7400 may perform processing of distortion correction or alignment or the like on the received image data, and may combine the processed image data and data of an image captured by a different image pickup unit 7410 to generate an overhead view image or a panorama image. The out-vehicle information detection unit 7400 may perform viewpoint conversion processing with the data of the image captured by the different image pickup unit 7410.

The in-vehicle information detection unit 7500 detects information inside a vehicle. A driver-state detection unit 7510 that detects a state of a driver is connected to the in-vehicle information detection unit 7500, for example. The driver-state detection unit 7510 may include a camera for capturing the driver, a biosensor for detecting biometric information regarding the driver, a microphone for collecting voice in the vehicle compartment, and the like. The biosensor is provided, for example, at a seating face, a steering wheel, or the like, and detects biometric information regarding an occupant sitting on the seat or the driver holding the steering wheel. The in-vehicle information detection unit 7500 may calculate the degree of fatigue or the degree of concentration of the driver and may determine whether or not the driver is dozing off, on the basis of the detection information input from the driver-state detection unit 7510. The in-vehicle information detection unit 7500 may perform noise canceling processing or the like on a voice signal of the collected voice.

The integrated control unit 7600 controls the overall operation in the vehicle control system 7000, in accordance with various programs. An input unit 7800 is connected to the integrated control unit 7600. The input unit 7800 can be provided, for example, with a device such as a touch panel, a button, a microphone, a switch, or a lever with which an occupant can perform an input operation. Data obtained by performing of voice recognition on voice input by the microphone may be input into the integrated control unit 7600. The input unit 7800 may be, for example, a remote control device that is to use infrared rays or other radio waves, or an external connection device such as a mobile phone or a personal digital assistant (PDA) in response to an operation of the vehicle control system 7000. The input unit 7800 may be, for example, a camera, and in such a case, an occupant can input information with gesture. Alternatively, data obtained by detection of movement of a wearable device worn by an occupant may be input. Moreover, the input unit 7800 may include, for example, an input control circuit or the like that generates an input signal on the basis of information input by an occupant or the like with the above input unit 7800 and outputs the input signal to the integrated control unit 7600. The occupant or the like operates the input unit 7800 to input various pieces of data into the vehicle control system 7000 or instructs the vehicle control system 7000 on a processing operation.

The storage unit 7690 may include a read only memory (ROM) that stores various programs to be executed by a microcomputer, and a random access memory (RAM) that stores various parameters, computed results, sensor values, or the like. Furthermore, the storage unit 7690 may be provided with a magnetic storage device such as a hard disc drive (HDD), a semiconductor storage device, an optical storage device, or a magneto-optical storage device, or the like.

The general-purpose communication I/F 7620 is a general-purpose communication I/F that mediates communication with various devices present in external environment 7750. There may be implemented in the general-purpose communication I/F 7620, a cellular communication protocol such as global system of mobile communications (GSM), WiMAX, long term evolution (LTE), or LTE-Advanced (LTE-A), or a different wireless communication protocol such as wireless LAN (also referred to as Wi-Fi (registered trademark)), or Bluetooth (registered trademark). The general-purpose communication I/F 7620 may connect, for example, through a base station or an access point, to a device (e.g., an application server or a control server) present on an external network (e.g., the Internet, a cloud network, or a business operator's specific network). Furthermore, the general-purpose communication I/F 7620 may connect to a terminal present near the vehicle (e.g., a terminal of a driver, a pedestrian, or a shop, or a machine type communication (MTC) terminal, for example, with a peer-to-peer (P2P) technology.

The dedicated communication I/F 7630 is a communication I/F that supports a communication protocol formulated for use in a vehicle. For example, there may be implemented in the dedicated communication I/F 7630, a standard protocol such as wireless access in vehicle environment (WAVE) or dedicated short range communications (DSRC) each of which is a combination of lower layer IEEE 802.11p and upper layer IEEE 1609, or a standard protocol such as a cellular communication protocol. Typically, the dedicated communication I/F 7630 performs vehicle-to-x (V2X) communication that is a concept including at least one of vehicle-to-vehicle communication, vehicle-to-infrastructure communication, vehicle-to-home communication, or vehicle-to-pedestrian communication.

The positioning unit 7640, for example, receives a global navigation satellite system (GNSS) signal (for example, a global positioning system (GPS) signal from a GPS satellite) from a GNSS satellite to perform positioning, and then generates location information including the latitude, longitude, and altitude of the vehicle. Note that the positioning unit 7640 may specify the current location by exchanging signals with a wireless access point, or may acquire the location information from a terminal such as a mobile phone, a personal handyphone system (PHS), or a smart-phone each having a positioning function.

The beacon receiving unit 7650, for example, receives radio waves or electromagnetic waves transmitted from a radio station or the like installed on a road, and acquires information regarding the current location, congestion, road closure, required time, or the like. Note that the function of the beacon receiving unit 7650 may be included in the dedicated communication I/F 7630 described above.

The in-vehicle device I/F 7660 is a communication interface that mediates connection between the microcomputer 7610 and various in-vehicle devices 7760 present in the vehicle. The in-vehicle device I/F 7660 may establish a wireless connection by using a wireless communication protocol such as wireless LAN, Bluetooth (registered trademark), near field communication (NFC), or wireless universal serial bus (WUSB). Furthermore, the in-vehicle device I/F 7660 may establish wired communication such as universal serial bus (USB), high-definition multimedia interface (HDMI), or mobile high-definition link (MHL), through a connection terminal that is not illustrated (and a cable if necessary). The in-vehicle device 7760 may include, for example, at least one of a mobile device or a wearable device possessed by an occupant, or an information device carried in or attached to the vehicle. Furthermore, the in-vehicle device 7760 may include a navigation device that searches a route to any destination. The in-vehicle device I/F 7660 exchanges control signals or data signals with these in-vehicle devices 7760.

The on-board network I/F 7680 is an interface that mediates communication between the microcomputer 7610 and the communication network 7010. The on-board network I/F 7680 transmits and receives signals and the like in accordance with a predetermined protocol supported by the communication network 7010.

The microcomputer 7610 of the integrated control unit 7600 controls the vehicle control system 7000 in accordance with various programs, on the basis of information acquired through at least one of the general-purpose communication I/F 7620, the dedicated communication I/F 7630, the positioning unit 7640, the beacon receiving unit 7650, the in-vehicle device I/F 7660, or the on-board network I/F 7680. For example, the microcomputer 7610 may compute, on the basis of acquired in-vehicle and out-vehicle information, a control target value of the driving force generating device, the steering mechanism, or the braking device, and may output a control command to the drive system control unit 7100. For example, the microcomputer 7610 may perform coordinated control for the purpose of providing the function of advanced driver assistance system (ADAS) including collision avoidance or impact mitigation of the vehicle, follow-up traveling based on an inter-vehicle distance, vehicle-speed maintained traveling, vehicle collision warning, vehicle lane departure warning, or the like. Furthermore, the microcomputer 7610 may control, on the basis of acquired vehicle peripheral information, the driving force generating device, the steering mechanism, the braking device, or the like, and may perform coordinated control for the purpose of automatic driving or the like, that the vehicle autonomously travels without depending on the operation of the driver.

The microcomputer 7610 may generate three-dimensional distance information between the vehicle and an object such as a surrounding structure and a person, on the basis of information acquired through at least one of the general-purpose communication I/F 7620, the dedicated communication I/F 7630, the positioning unit 7640, the beacon receiving unit 7650, the in-vehicle device I/F 7660, or the on-board network I/F 7680, and may create local map information including peripheral information at the current location of the vehicle. Furthermore, the microcomputer 7610 may predict, on the basis of acquired information, danger such as collision of the vehicle, approach of a pedestrian or the like, or entry into a closed road, and may generate a warning signal. The warning signal may be, for example, a signal for generating an alarm sound or for turning on a warning lamp.

The voice and image output unit 7670 transmits an output signal of at least one of voice or an image to an output device capable of visually or audibly notifying the occupant of the vehicle or the outside of the vehicle of information. In the example of FIG. 15, an audio speaker 7710, a display unit 7720, and an instrument panel 7730 are exemplified, as an output device. The display unit 7720 may include at least one of an on-board display or a head-up display, for example. The display unit 7720 may have an augmented reality (AR) display function. The output device may be a wearable device other than these devices, such as a headphone or a spectacular display to be worn by an occupant, a projector, a lamp, or the like. In a case where the output device is a display device, the display device visually displays results obtained by the various types of processing executed by the microcomputer 7610 or information received from the other control unit, in various formats such as text, image, table, or graph. Furthermore, in a case where the output device is a voice output device, the voice output device converts an audio signal of reproduced voice data, acoustic data, or the like into an analog signal to audibly output the resulting signal.

Note that, in the example illustrated in FIG. 15, at least two control units connected through the communication network 7010 may be integrally formed as one control unit. Alternatively, the individual control units may include a plurality of control units. Moreover, the vehicle control system 7000 may include another control unit that is not illustrated. Furthermore, in the above description, some or all of the functions performed by any of the control units may be provided to the other control unit. That is, as long as information is transmitted and received through the communication network 7010, predetermined computing processing may be performed by any of the control units. Similarly, the sensor or the device connected to any of the control units may be connected to the other control unit, and the plurality of control units may mutually transmit and receive detection information through the communication network 7010.

Note that a computer program for controlling the operation of the solid-state image pickup element 1 according to each embodiment described with reference to FIG. 1 and the like can be implemented in any of the control units or the like. Furthermore, there can be provided a computer readable recording medium that stores such a computer program therein. Examples of the recording medium include a magnetic disk, an optical disk, a magneto-optical disk, a flash memory, and the like. Furthermore, the above computer program may be distributed through, for example, a network without using a recording medium.

In the vehicle control system 7000 of FIG. 15 described above, the solid-state image pickup element 1 according to each embodiment described with reference to FIG. 1 and the like corresponds to the image pickup unit 7410 and the out-vehicle information detector 7420.

The embodiments of the present disclosure are not limited to the above-described embodiments, and various modifications can be made without departing from the gist of the present disclosure.

For example, there can be adopted a form in which all or some of the above-described plurality of embodiments are combined.

The above-described solid-state image pickup element 1 is a vertical-dispersion type solid-state pickup element including: the photoelectric conversion unit 60 formed outside the semiconductor substrate 12, the photoelectric conversion unit 60 performing photoelectric conversion on green wavelength light; and the photodiodes PD1 and PD2 in the semiconductor substrate 12, the photodiodes PD1 and PD2 performing photoelectric conversion on blue wavelength light and red wavelength light, respectively. Instead of such a vertical-dispersion type solid-state pickup element, there can also be adopted a configuration of a solid-state image pickup element 1 that includes: a so-called panchromatic film, as a photoelectric conversion unit 60, having sensitivity over the entire visible wavelength range; and a color filter such as a Bayer array being formed above the photoelectric conversion unit 60. In this case, photodiodes PD1 and PD2 in the semiconductor substrate 12 are not formed. Thus, examples of a lower electrode 63 that can be used include metals such as: aluminum; vanadium; gold; silver; platinum; iron; cobalt; carbon; nickel; tungsten; palladium; magnesium; calcium; tin; lead; titanium; yttrium; lithium; ruthenium; and manganese, and alloys thereof.

Furthermore, the above-described solid-state image pickup element 1 includes the photoelectric conversion unit 60 formed outside the semiconductor substrate 12, the photoelectric conversion unit 60 performing photoelectric conversion on green wavelength light. The solid-state image pickup element 1, however, may have a configuration in which photoelectric conversion is performed on a different color of wavelength light. In other words, in the vertical-dispersion type solid-state image pickup element 1, there may be appropriately switched wavelength light to be photoelectrically converted by three photoelectric conversion units.

Examples of a material in the case of using the photoelectric conversion unit 60 as the organic photoelectric conversion film 62 having sensitivity only to red include a combination of organic materials containing a phthalocyanine compound (electron-donating substance) and a fluorine-substituted phthalocyanine compound (electron-accepting substance).

Examples of a material in the case of using the photoelectric conversion unit 60 as the organic photoelectric conversion film 62 having sensitivity only to blue include a combination of organic materials containing a coumarin compound (electron-donating substance) and a silole compound (electron-accepting substance).

Furthermore, as the material of the organic photoelectric conversion film 62, an inorganic photoelectric conversion material may be adopted instead of an organic photoelectric conversion material. Examples of the inorganic photoelectric conversion material include: crystalline silicon; amorphous silicon; compound semiconductors; and the like, such as a Cu—In—Ga—Se (CIGS) compound, a Cu—In—Se (CIS) compound, a chalcopyrite structured semiconductor, and GaAs.

Furthermore, in each of the above-described embodiments, one photoelectric conversion unit 60 that photoelectrically converts one color of wavelength light is provided above the semiconductor substrate 12. However, two or more photoelectric conversion units 60 may be provided to photoelectrically convert two or more colors of wavelength light above the semiconductor substrate 12.

In the examples described above, the solid-state image pickup element 1 includes one piece of semiconductor substrate 12. The solid-state image pickup element 1, however, may have a layered structure including two or three pieces of semiconductor substrates.

In the above-described examples, the example of the backside-irradiation type solid-state image pickup element has been described. The technology of the present disclosure, however, is not limited to such a back-irradiation type, and also applicable to a front-irradiation type solid-state image pickup element.

In the above-described examples, there has been described the solid-state image pickup element including the first conduction type as P-type, the second conduction type as N-type, and electrons as signal charges. The present disclosure, however, also is applicable to a solid-state image pickup element including holes as signal charges. In other words, each of the aforementioned semiconductor regions can be a semiconductor region including an opposite conduction type with the first conduction type as N-type or the second conduction type as P-type.

Furthermore, the technology of the present disclosure is not limited to application to a solid-state image pickup element that senses the distribution of the amount of incident light for visible light and captures such a distribution as an image. The technology of the present disclosure is also applicable to a solid-state image pickup element that captures, as an image, the distribution of the incident amount of infrared rays, X-rays, particles, or the like and applicable to, as broadly defined, solid-state image pickup elements (physical-quantity distribution detection devices) in general such as a fingerprint detection sensor that senses the distribution of other physical quantities such as pressure and electrostatic capacity and captures such a distribution as an image.

Note that the effects described in the present specification are merely examples and are not limited, and may have effects other than those described in the present specification.

Note that the present disclosure can also take the following configurations.

(1)

A solid-state image pickup element including:

a photoelectric conversion film formed above a semiconductor substrate; and a sidewall sealing a side face of the photoelectric conversion film, the sidewall including a re-deposited film of a film directly under the sidewall.

(2)

The solid-state image pickup element according to the above-described (1), further including:

an upper electrode disposed on the photoelectric conversion film; and a lower electrode disposed beneath the photoelectric conversion film, in which the lower electrode is formed separately for each pixel, and a side face of the upper electrode is covered with the sidewall.

(3)

The solid-state image pickup element according to the above-described (2), in which the upper electrode is formed separately for each pixel.

(4)

The solid-state image pickup element according to any of the above-described (1) to (3), in which the film directly under the sidewall includes an insulating film.

(5)

The solid-state image pickup element according to any of the above-described (1) to (3), in which the film directly under the sidewall includes any material of SiO, SiCO, AlO, AlN, SiN, SiON, SiCN, and SiCNO.

(6)

The solid-state image pickup element according to any of the above-described (2) or (3), further including:

a dummy film in a layer of a peripheral circuit unit outside a pixel array unit, the layer identical in depth to a layer including the lower electrode, the dummy film being different in polishing rate from an insulating film between a plurality of the lower electrodes.

(7)

The solid-state image pickup element according to the above-described (6), in which the dummy film is lower in the polishing rate than the insulating film between the plurality of the lower electrodes.

(8)

The solid-state image pickup element according to the above-described (6) or (7), in which the dummy film includes any material of SiN, SiON, SiCO, SiCN, SiCNO, ITO, or IZO.

(9)

The solid-state image pickup element according to any of the above described (6) to (8), in which a height of an upper face of the dummy film is identical to or lower than a height of an upper face of the lower electrode.

(10)

A method of manufacturing a solid-state image pickup element, the method including:

forming a photoelectric conversion film above a semiconductor substrate; and forming a sidewall sealing a side face of the photoelectric conversion film, the sidewall including a re-deposited film of a film directly under the sidewall.

(11)

An electronic device including:

a solid-state image pickup element including:

a photoelectric conversion film formed above a semiconductor substrate; and a sidewall sealing a side face of the photoelectric conversion film, the sidewall including a re-deposited film of a film directly under the sidewall.

(12)

A solid-state image pickup element including: a photoelectric conversion film formed above a semiconductor substrate;

a lower electrode formed separately for each pixel, beneath the photoelectric conversion film; and a dummy film in a layer of a peripheral circuit unit outside a pixel array unit, the layer identical in depth to a layer including the lower electrode, the dummy film being different in polishing rate from an insulating film between a plurality of the lower electrodes.

(13)

The solid-state image pickup element according to the above-described (12), in which the dummy film is lower in the polishing rate than the insulating film between the plurality of the lower electrodes.

(14)

The solid-state image pickup element according to the above-described (12) or (13), in which the dummy film includes any material of SiN, SiON, SiCO, SiCN, SiCNO, ITO, or IZO.

(15)

The solid-state image pickup element according to any of the above-described (12) to (14), in which a height of an upper face of the dummy film is identical to or lower than a height of an upper face of the lower electrode.

(16)

The solid-state image pickup element according to any of the above-described (12) to (15), further including:

a sidewall sealing a side face of the photoelectric conversion film, the sidewall including a re-deposited film of a film directly under the sidewall.

(17)

The solid-state image pickup element according to the above-described (16), in which the upper electrode is formed separately for each pixel, and a side face of the upper electrode is covered with the sidewall.

(18)

A method of manufacturing a solid-state image pickup element, the method including:

forming, above a semiconductor substrate, a lower electrode separated for each pixel and a dummy film in a layer of a peripheral circuit unit outside a pixel array unit, the layer identical in depth to a layer including the lower electrode, the dummy film being different in polishing rate from an insulating film between a plurality of the lower electrodes; and forming a photoelectric conversion film on an upper face of each of the plurality of the lower electrodes.

(19)

An electronic device including:

a solid-state image pickup element including:

a photoelectric conversion film formed above a semiconductor substrate;

a lower electrode formed separately for each pixel, beneath the photoelectric conversion film; and a dummy film in a layer of a peripheral circuit unit outside a pixel array unit, the layer identical in depth to a layer including the lower electrode, the dummy film being different in polishing rate from an insulating film between a plurality of the lower electrodes.

REFERENCE SIGNS LIST

1 Solid-state image pickup element
2 Pixel
3 Pixel array unit
12 Semiconductor substrate
21 Peripheral circuit unit
51, 52 Insulating film
54 Sidewall
55 CMP dummy film 56 Sealing film
57 Light-shielding film
58 Sealing film
60 Photoelectric conversion unit
61 Upper electrode
62 Organic photoelectric conversion film
63 Lower electrode
121 Insulating film
122 Sidewall
123, 131 CMP dummy film
200 Image pickup device
202 Solid-state image pickup element

The invention claimed is:

1. A solid-state image pickup element, comprising:
    a photoelectric conversion film above a semiconductor substrate;
    a plurality of lower electrodes beneath the photoelectric conversion film; and
    a sidewall that seals a side face of the photoelectric conversion film, wherein
        the sidewall includes a first film,
        the first film is a re-deposited film of a second film,
        the second film is directly under the sidewall, and
        the second film is between the plurality of lower electrodes.

2. The solid-state image pickup element according to claim 1, further comprising
    an upper electrode on the photoelectric conversion film, wherein
        each lower electrode of the plurality of lower electrodes corresponds to a respective pixel, and
        a side face of the upper electrode is covered with the sidewall.

3. The solid-state image pickup element according to claim 2, wherein the upper electrode corresponds to the respective pixel.

4. The solid-state image pickup element according to claim 1, wherein the second film includes an insulating film.

5. The solid-state image pickup element according to claim 1, wherein the second film includes one any material of SiO, SiCO, AlO, AlN, SiN, SiON, SiCN, or SiCNO.

6. The solid-state image pickup element according to claim 2, further comprising
    a dummy film in a layer of a peripheral circuit unit outside a pixel array unit, wherein
        a depth of the layer of the peripheral circuit unit is identical to a depth of a layer including the plurality of lower electrodes,
        a polishing rate of the dummy film is different from a polishing rate of the second film.

7. The solid-state image pickup element according to claim 6, wherein the polishing rate of the dummy film is lower than the polishing rate of the second film.

8. The solid-state image pickup element according to claim 6, wherein the dummy film includes one of SiN, SiON, SiCO, SiCN, SiCNO, ITO, or IZO.

9. The solid-state image pickup element according to claim 6, wherein a height of an upper face of the dummy film is identical to or lower than a height of an upper face of each lower electrode of the plurality of lower electrodes.

10. An electronic device, comprising:
    a solid-state image pickup element, wherein the solid-state image pickup element comprises:
        a photoelectric conversion film above a semiconductor substrate;
        a plurality of lower electrodes beneath the photoelectric conversion film; and
        a sidewall that seals a side face of the photoelectric conversion film, wherein
            the sidewall includes a first film,
            the first film is a re-deposited film of a second film,
            the second film is directly under the sidewall, and
            the second film is between the plurality of lower electrodes.

* * * * *